United States Patent [19]

Ikari, deceased et al.

[11] Patent Number: 5,188,924
[45] Date of Patent: Feb. 23, 1993

[54] PATTERN FORMING METHOD UTILIZING MATERIAL WITH PHOTORESIST FILM UNDERLAYER AND CONTRAST ENHANCEMENT OVERLAYER CONTAINING PHOTOSENSITIVE DIAZONIUM SALT

[75] Inventors: Kunihiro Ikari, deceased, late of Kamakura, Japan, by Masataka Miyamura, legal representative; Hirokazu Niki, Yokohama; Makoto Nakase, Tokyo; Toshiaki Shinozaki, Yokohama, all of Japan

[73] Assignee: Kabushiki Kaisha Toshiba, Kawasaki, Japan

[21] Appl. No.: 777,449

[22] Filed: Oct. 16, 1991

Related U.S. Application Data

[63] Continuation of Ser. No. 406,892, Sep. 13, 1989, abandoned, which is a continuation-in-part of Ser. No. 62,339, Jun. 9, 1987, abandoned, which is a continuation of Ser. No. 732,717, May 10, 1985, abandoned.

[30] Foreign Application Priority Data

| May 14, 1984 | [JP] | Japan | 59-94603 |
| Nov. 19, 1984 | [JP] | Japan | 59-242281 |
| Dec. 17, 1984 | [JP] | Japan | 59-264450 |

[51] Int. Cl.$^5$ .................... G03F 7/30; G03F 7/021
[52] U.S. Cl. .................... 430/312; 430/142; 430/158; 430/160; 430/163; 430/311; 430/325; 430/326; 430/329; 430/333; 430/334; 430/339
[58] Field of Search .................... 430/5, 28, 142, 156, 430/160, 166, 311, 312, 325, 326, 333, 334, 339, 163, 329

[56] References Cited

U.S. PATENT DOCUMENTS

| 2,114,468 | 4/1938 | van der Grinten | 430/146 |
| 2,702,243 | 2/1955 | Schmidt | 430/166 |
| 3,046,131 | 7/1962 | Schmidt et al. | 430/156 |
| 3,153,592 | 10/1964 | Klimkowski et al. | 430/151 |
| 3,353,984 | 11/1967 | Landau | 430/156 |
| 3,484,241 | 12/1969 | Evleth et al. | 430/156 |
| 3,965,278 | 6/1976 | Duinker et al. | 430/28 |
| 4,403,028 | 9/1983 | Mustacchi et al. | 430/163 |
| 4,663,275 | 5/1987 | West et al. | 430/327 |
| 4,677,049 | 6/1987 | Griffing et al. | 430/5 |
| 4,745,042 | 5/1988 | Sasago et al. | 430/156 |
| 4,777,111 | 10/1988 | Blumel et al. | 430/156 |
| 4,804,614 | 2/1989 | Halle | 430/142 |

FOREIGN PATENT DOCUMENTS

| 3144656 | 7/1982 | Fed. Rep. of Germany . |
| 3144657 | 9/1982 | Fed. Rep. of Germany . |
| 156740 | 9/1982 | German Democratic Rep. | 430/171 |
| 64-971 | 5/1979 | Japan . |
| 70761 | 6/1979 | Japan . |
| 104642 | 6/1984 | Japan . |

OTHER PUBLICATIONS

Howe et al., *Photo Sci. & Eng.*, vol. 23, No. 6, Nov./-Dec. -1979, pp. 370-374.

(List continued on next page.)

Primary Examiner—Charles L. Bowers, Jr.
Assistant Examiner—Christopher G. Young
Attorney, Agent, or Firm—Foley & Lardner

[57] ABSTRACT

A pattern forming method, comprising the steps of providing a resist film on a substrate; providing a photosensitive film containing a photosensitive diazonium salt on the resist film; and then subjecting the resultant composite to pattern exposure by use of a light to which both of the resist film and the photosensitive diazonium salt are sensitive, can employ a composition for pattern formation which comprises a photosensitive diazonium salt, a resin binder and a solvent. By this method, a minute pattern of 1 μm or less can be formed, utilizing effectively the UV-ray exposure technique of the prior art, with good dimensional precision and stability.

21 Claims, 5 Drawing Sheets

OTHER PUBLICATIONS

Dinaburg, M. S., "Photosensitive Diazo Compounds", 1964, Focal Press, pp. 91–93.

Robert E. Williams, Jr., et al., "Altilith ® CEM-420: A New Contrast Enhancement Material for G-line Steppers," General Electric Microelectronic Materials, pp. 1–5.

English Abstract of Japanese Publication #52-130, 286, Hitachi KK, issued 11/1977.

English Abstract of Japanese Publication #54-64, 971, issueed May 1979.

English Abstract of Japanese Publication #54-70761, issued Jun. 1979.

English Abstract of Japanese Publication #59-104642, General Electric Co., issued Jun. 1984.

Griffing; Contrast Enhanced Photolithography; IEEE Electron Device Letters (1983); vol. 4; pp. 14–16.

Maddox et al.; Applications of Reactive Plasma Practical Microelectronic Processing Systems; Solid State Technology (1978); 107–113.

PATTERN FORMING METHOD UTILIZING MATERIAL WITH PHOTORESIST FILM UNDERLAYER AND CONTRAST ENHANCEMENT OVERLAYER CONTAINING PHOTOSENSITIVE DIAZONIUM SALT

This application is a continuation of application Ser. No. 07/406,892, filed Sep. 13, 1989, now abandoned; which is a continuation-in-part of Ser. No. 07/062,339 filed Jun. 2, 1987, now abandoned; which is a continuation of Ser. No. 06/732,717 filed May 10, 1985, now abandoned.

This invention relates to a pattern forming method suitable for minute working and a composition for pattern formation to be used therefor. More particularly, the present invention relates to a method for pattern formation for obtaining a minute pattern by a simple method and yet with good dimensional precision and stably, and also to a composition for pattern formation to be used therefor.

In production of integrated circuits, there exists a step of forming a minute pattern on a semiconductor wafer. This step generally involves the operations as described below. First, a substrate such as wafer is coated with a resist solution and dried to form a resist film thereon. Thereafter, with this resist film brought into contact with a desired pattern, a light to which the resist film is sensitive is irradiated thereon to effect pattern exposure. Next, the resist film is developed to form a desired minute pattern.

The degree of integration in integrated circuits has been made higher in density at a rate of about 4-fold within every 2 to 3 years, and correspondingly the dimensions of the patterns required for minute working of an element are becoming increasingly minute, and also severe control is demanded for dimensional precision. In response to these demands, developments of pattern forming techniques which can form minute patterns and yet can maintain dimensional precision in spite of changes in steps are now under progress with vigorous efforts, not only in exposure devices, but in both aspects including the resist material to be used therefor.

One of the factors that limits the resolution necessary for formation of a minute pattern is the diffraction phenomenon based on the wave characteristic of light (corpuscular beam). The diffraction theory indicates that the resolution of the exposure system will be increased as the wavelength of the light (corpuscular beam) is shorter. For this reason, developments of the exposure techniques employing far UV-ray (wavelength 200–300 nm), X-ray and electron beam are progressing. However, there are involved the problems that these techniques require an expensive device and also that it is deficient in bulk productivity. Accordingly, under such the present situation only the electron beam exposure technique is used for mask pattern formation for wafer working among these techniques. On the other hand, if the UV-ray exposure technique (wavelength 300–450 nm) which has conventionally been used in the prior art is applicable, the prior art techniques are available as such to be very advantageous in bulk productivity and also in aspect of economy. Practically, there remains sufficient room for improving the UV-ray exposure technique so as to be applicable for submicron minute working of ultra-LSI. The elemental techniques required for improvement of UV-ray exposure technique as viewed from the standpoint of pattern miniaturization are as follows:

(1) to shorten wavelength of the light to be used for image formation system;
(2) to employ an optical system with a large numerical aperture;
(3) to enlarge $\gamma$-value (contrast) of the resist;
(4) to make thinner the resist film; and
(5) to improve optical contrast for the resist by provision of a bleaching thin film.

The techniques (1) and (2) concern primarily improvement of optical system, and improvement of resolution can be expected also from the optical theory, but no sufficient dose can be obtained at a short wavelength due to decreased transmittance of the lens. Further, enlargement of a numerical aperture will pose a problem such that the focal depth becomes shallower to become weak against uneven steppage difference on the wafer surface. On the other hand, (3), (4) and (5) concern improvement of the resist itself.

If the $\gamma$-value is increased, in addition to increase in resolution, a sharp pattern will be obtained, and there is also the advantage of no film loss during development. Approaches to increase the $\gamma$-value, which depend directly on the chemical structure of the resist material, cannot be described in depth here, but the proposed methods include (1) the method in which the molecular distribution of the polymeric material is narrowed and (2) the method in which a material which is faded by photolysis through absorption of the light to which the resist is sensitive is incorporated in the resist material (Japanese Provisional Patent Publication No. 130286/1977). However, the method (1), which is generally applied for a cross-linked type resist, is limited to the attainable $\gamma$-value, while approach (2), which can give some effect, is limited in the amount of the fading material added, because the resist function is affected thereby. In view of such situations, improvement of $\gamma$-value is also limited.

If the film thickness of the resist is made thinner, the extent of unfocused image based on the scattering phenomenon of light will be reduced to result in improvement of resolution. But if the film is made too thin, there will ensure a problem such as formation of pinholes during film formation.

On the other hand, one may consider that resolution can be improved without adverse effect on the resist function by provision of a photosensitive thin film containing a photobleachable material on the resist film. B. F. Griffing et al. proposed to provide a photosensitive layer containing a bleaching dye on a positive-type resist film (IEEE, ELECTRON DEVICE LETTERS Vol. EDL-4, (1) 14 (1983)]. Also, there has been proposed a method to improve substantially the optical contrast by providing a photobleachable positive-type resist film on a negative-type resist film (Japanese Provisional Patent Publications No. 64971/1979 and No. 70761/1979).

The specific feature of these methods resides in apparent improvement in optical contrast relative to the resist by alternating the illumination distribution of the pattern to pass through the photobleachable film. In other words, the faded quantity is smaller at a shadow portion where the dose is relatively smaller, while conversely it is greater at a highlight portion. Accordingly, as compared with the shadow portion, the transmitted light at the highlight portion is relatively intensified, which means that apparent optical contrast has been improved relative to the resist film.

For practicing effectively the improved optical contrast method, the photobleachable substance is required to satisfy the following conditions:
(1) to absorb sufficiently the light to which the resist is exposed and fade sufficiently;
(2) the fading speed should be approximate to the photosensitive speed of the resist; and
(3) after fading, it should be faded into a sufficiently transparent material.

When a dye such as Rhodamine 6G is used as the photobleachable material, the fading speed is slow and therefore it is practically difficult to apply a dye. Japanese Provisional Patent Publications No. 64971/1979 and No. 70761/1979 disclose substantial improvement of optical contrast by use of a positive-type resist itself as a photobleachable material. However, in these methods, there is involved the problem that the coefficient of light absorption of the positive-type resist is small, whereby the light of the shadow portion cannot sufficiently be shielded. If the film thickness of the resist is made thick, there is involved the problem, although the light shielding ability can be improved, that the image will become unfocused, thereby worsening the resolution.

Also, Japanese Provisional Patent Publication No. 104642/1984 discloses use of arylnitrone as the color fading substance. When this substance is used, due to large coefficient of light absorption, the photosensitive film can be made thin to result in improvement of resolution. However, susceptible to decomposition by water or heat, thus posing a problem in difficult control in the manufacturing steps. Accordingly, there is also involved the problem that it is not possible to produce minute patterns stably.

Further, if impurities such as an alkali metal ion ($Na^+$, $K^+$, etc.) or a transition metal ion are contained in a photoresist, these ions cause problems that they cause fluctuation in Vth or make unstable MOS transistor, increase P-n conjunction leak and also increase defect density of pressure resistance of Gate oxide film, etc. (see, for example, "Semicon NEWS", pp. 40 to 44, No. 11 (1988); "SOLID STATE TECHNOLOGY", April, pp. 107 to 113 (1978); etc.).

SUMMARY OF THE INVENTION

An object of the present invention is to provide a method for pattern formation which has overcome the problems as described above, is suitable for minute working even by use of visible light and can give minute patterns with good dimensional precision and stability by a simple method, and a composition for pattern formation to be used therefor.

The present inventors have studied intensively about the materials of the photosensitive film to be formed on the resist film in order to accomplish the above object. They found that the photosensitive film containing photosensitive diazonium salts as described hereinafter has the advantages of having sufficiently greater light shielding ability against UV-rays with wavelengths of 300–450 nm as compared with the color fading dye or positive-type resist itself used in the prior art, having a light fading speed approximate to the sensitizing speed of the resist, giving a substantially transparent film after bleaching and cancelling problems caused by impurities such as metal ions, to develop the pattern forming method and a composition to be used therefor of the present invention.

More specifically, the pattern forming method of the present invention comprises the steps of providing a resist film on a substrate; providing a photosensitive film containing a photosensitive diazonium salt on the resist film; and then subjecting the resultant composite to pattern exposure by use of a light to which both of the resist film and the photosensitive diazonium salt are sensitive.

The composition to be used in the pattern forming method of the present invention comprises a photosensitive diazonium salt, a resin binder and a solvent.

In the composition for pattern formation of the present invention, there may further be contained organic acids.

BRIEF DESCRIPTION OF THE DRAWINGS

FIG. 2 and FIG. 4 being graphs showing dependency of variance in dimensional precision on line width; and FIG. 5 through FIG. 8 are graphs showing relationship between the deviation from the mask dimension of the pattern formed in Example 20 and the exposure time; and all the marks —●— representing the results of the invention and marks —○— those of Comparative example, respectively.

DESCRIPTION OF THE PREFERRED EMBODIMENTS

Figure 1:
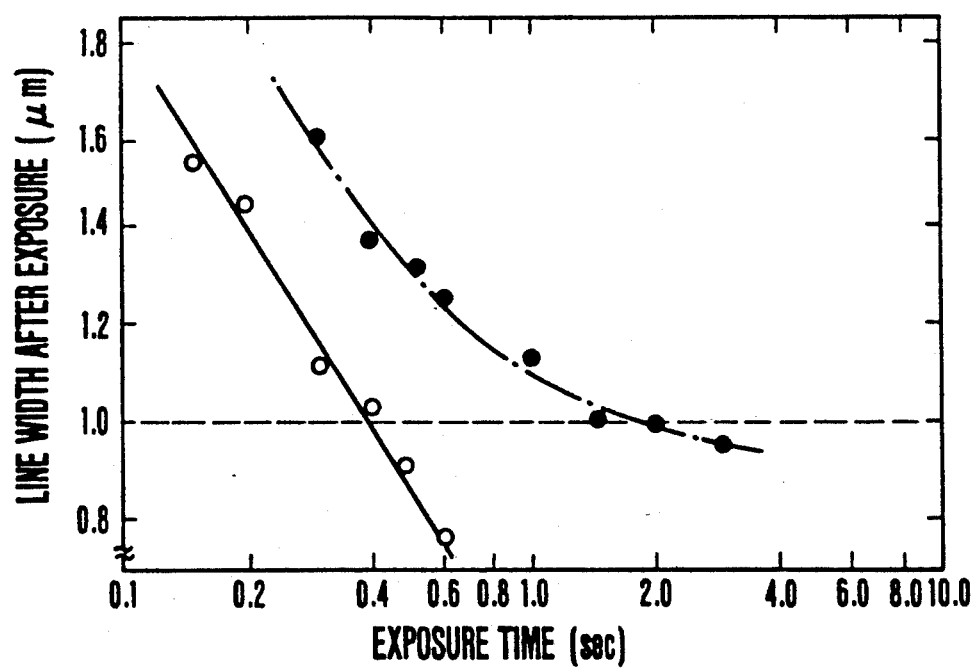
FIG. 1 through FIG. 9 are graphs for explanation of the effects of the present invention, FIG. 1 and FIG. 3 being graphs showing dependency of the line width after pattern developing on exposure time.

The minute pattern forming method of the present invention is described in detail below.

In the method of the present invention, first a resist film is formed on a semiconductor wafer. The resist used in not particularly limited and may include, for example, the so-called positive-type resist comprising an esterified product of naphthoquinonediazidesulfonic acid and cresol novolac resin, the so-called rubbery negative-type resist comprising a bisazide compound formulated in a cyclized polyisoprene, a negative-type resist comprising an azide compound formulated in polyvinylphenol resin or phenol-novolac resin, various resist materials comprising bichromates formulated in a water-soluble resin, water-soluble resist comprising a bisazide compound formulated in polyvinylpyrrolidone and others.

Then, on the resist film is applied the composition for pattern formation of the present invention, namely a photosensitive solution comprising a photosensitive diazonium salt as described below and a resin binder dissolved in a suitable solvent by, for example, a spinner, followed by drying, to provide a photosensitive film thereon. Next, by use of light acting on both the resist and the diazonium salt, pattern exposure is effected. Next, the diazo photosensitive layer is removed, followed subsequently by developing the resist layer, to give a pattern.

As the photosensitive diazonium salts to be used in the method and the composition of the present invention, any of those known in the prior art may be available. For example, as such diazonium salts, those described in the following literatures may be available:
(1) J. Kosar "Light Sensitive Systems" (1965, J. Wiley Sons Inc., N.Y.), page 194;

(2) M. S. Dinaburg "Photosensitive Diazo Compounds and Their Uses" (1964, The Focal Press); and
(3) R. Patai "The Chemistry of Diazonium and Diazo Groups, Part I, II" (1978, J. Wiley).

In the pattern forming method and the composition to be used therefor, it is particularly preferred to use at least one selected from the diazonium salt compounds represented by the following formulae (I)-(IX).

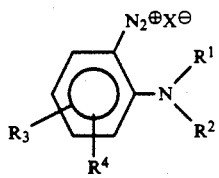
(I)

wherein $R^1$ and $R^2$ may be either identical or different and represent alkyl groups, or $R^1$ and $R^2$ taken together may be cyclized through a carbon, oxygen or nitrogen atom; $R^3$ and $R^4$ may be either identical or different and each represent a hydrogen atom, an alkyl group, an aryl group, an aralkyl group, an alkoxy group, an alkylmercapto group, an aralkylmercapto group, an acyl group, a halogen atom, a sulfo group or a carboxyl group; and $X^\ominus$ represents a halogen ion or an anion constituted of a halide of boron, aluminum, iron, zinc, arsenic, antimony or phosphorus.

In the above formula (I), $R^1$ and $R^2$ each represent an alkyl group, or $R^1$ and $R^2$ taken together may be cyclized through carbon, oxygen or nitrogen atom; $R^3$ and $R^4$ each represent hydrogen atom, or a substituent such as an alkyl group, an aryl group, an aralkyl group, an alkoxy group, an alkylmercapto group, an aralkylmercapto group, an acyl group, a halogen atom, a sulfo group or a carboxyl group; and $X^\ominus$ represents a halogen ion or an anion constituted of a halide of boron, aluminum, iron, zinc, arsenic, antimony or phosphorus, Typical examples of the diazonium salts represented by the formula (I) may include 3,4-dimethyl-6-pyrrolidylbenzenediazonium salts, 3,4-dimethyl-6-morpholinobenzenediazonium salts, 4-benzoyl-2-(N,N-dimethylamino)benzenediazonium salts, 2-(N,N-diphenylamino)benzenediazonium salts, 3-bromo-6-(N,N-dimethylamino)-5-methylthiobenzenediazonium salts, 4-acetylamino-2-(N,N-dimethylamino)diazonium salts, 4-ethoxy-2-(N,N-dimethylamino)benzenediazonium salts, 3-methoxy-4-benzoylamino-2-piperidinobenzenediazonium salts and the like.

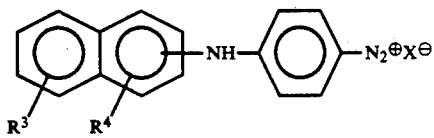
(II)

wherein $R^3$, $R^4$ and $X^\ominus$ are the same as defined above.

In the above formula (II), $R^3$ and $R^4$ each represent a hydrogen atom or a substituent such as an alkyl group, an aryl group, an aralkyl group, an alkoxy group, an alkylmercapto group, an aralkylmercapto group, an acyl group, a halogen atom, a sulfo group, a carboxyl group, etc, and X represents a halogen ion or an anion constituted of a halide of boron, aluminum, iron, zinc, arsenic, antimony, phosphorus, etc.

Typical examples of the diazonium salts represented by the formula (II) may include 4-α-naphthylaminobenzenediazonium salts, 4-β-naphthylaminobenzenediazonium salts, 4,6'-sodiumsulfonate-β-naphthylaminobenzenediazonium salts, 4-5'-acenaphtheneaminobenzenediazonium salts, diazo compounds of 5-(4-aminophenylamino)-1,8-naphthosultane.

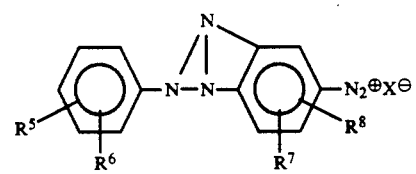
(III)

wherein $R^5$, $R^6$, $R^7$ and $R^8$ may be either identical or different and each represent a hydrogen atom, a halogen atom, an amino group, a sulfo group, a carboxyl group, an alkyl group, an alkoxy group, a dialkylamino group, an alkylmercapto group or an acyl group each having 1 to 6 carbon atoms, an aryl group or an aralkyl group each having 6 to 12 carbon atoms; and X represents a halogen ion, a sulfate ion or an anion consisting of a halide of either boron, phosphorus, zinc, arsenic, aluminum, iron or antimony.

In $R^5$, $R^6$, $R^7$, $R^8$ of the above formula, when they are alkyl groups, alkoxy groups, dialkylamino groups, alkylmercapto groups or acyl groups, those having carbon atoms greater than 6 are not preferable, because solubility and film forming property will lowered. Also, in the case of aryl groups or aralkyl groups, those having carbon atoms greater than 12 are not preferable for the same reason.

Preferable examples of the anion: $X^\ominus$ may be $BF_4^\ominus$, $PF_6^\ominus$, $HSO_4^\ominus$, $\frac{1}{2}SO_4^{2\ominus}$, $ZnCl_2 \cdot Cl^\ominus$, etc.

Such diazonium salts represented by the formula (III) may be, for example, 2-(4'-methoxyphenyl)-6-chloro-1,3-benzotriazole-5-diazonium salts, 2-(4'-methoxyphenyl)-6-methyl-1,3-benzotriazole-5-diazonium salts, 2-naphthyl-1,3-benzotriazole-5-diazonium salts, 2-(3'-N,N-dimethylaminonaphthyl)-1,3-benzotriazole-5-diazonium salts and the like.

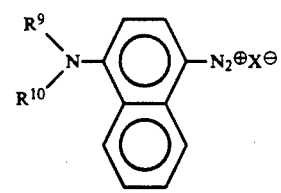
(IV)

wherein $R^9$ and $R^{10}$ each represent a hydrogen atom, a halogen atom, an alkyl group, an alkenyl group, an alkoxy group, an aryl group, an aralkyl group, an amino group, a dialkylamino group, an alkylmercapto group, an acyl group, a sulfo group, a carboxyl group or

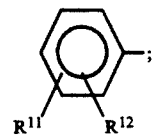
;

where $R^{11}$ and $R^{12}$ each represent a hydrogen atom, a halogen atom, an alkyl group, an alkenyl group, an alkoxy group, an aryl group, an aralkyl group, an amino group, a dialkylamino group, an alkylmercapto group, an acyl group, a sulfo group or a carboxyl group; and X represents an anion capable of forming a diazonium salt.

In the above formula (IV), $R^9$ and $R^{10}$ each represent a hydrogen atom, a halogen atom, an alkyl group, an alkenyl group, an alkoxy group, an aryl group, an aralkyl group, an amino group, a dialkylamino group, an alkylmercapto group, an acyl group, a sulfo group, a carboxyl group or

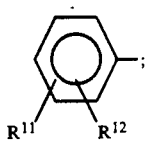

$R^{11}$ and $R^{12}$ each represent a hydrogen atom, an alkyl group, an alkenyl group, an alkoxy group, an aryl group, an aralkyl group, an amino group, a dialkylamino group, an alkylmercapto group, an acyl group, a sulfo group or a carboxyl group; and X represents an anion capable of forming a diazonium salt.

Here, the halogen atom may be a fluorine atom, a chlorine atom, a bromine atom and an iodine atom. The alkyl group and the alkenyl group refer to straight or branched alkyl groups and alkenyl groups having 1 to 5 carbon atoms, respectively. The aryl group is an unsubstituted or substituted phenyl group, and the substituent on the phenyl group may be any one, provided it does not interfere with photosensitization of the diazonium compound to a light with a wavelength of 300 nm or longer to not more than 450 nm. The alkyl moiety in the alkoxy group, the dialkylamino group, the alkylmercapto group and the acyl group has the same meaning as described above. Also, the aryl moiety in the aralkyl group has the same meaning as described above, and the alkylene group included in the aralkyl group refers to one having 1 to 3 carbon atoms.

On the other hand, the anion capable of forming a diazonium salt represented by X is not specifically limited, but may include, for example, a halogen ion, a sulfate ion or an anion consisting of a halogen compound of boron, phosphorus, zinc, arsenic, aluminum, iron and antimony.

Typical examples of the diazonium salts represented by the formula (IV) may include 4-N-phenylaminonaphthalene diazonium salts, 4-N-(4'-methoxy-phenyl)amino-naphthalenediazonium salts, 4-N-(2',5'-dimethoxyphenyl)aminonaphthalenediazonium salts, 4-N-(4'-N,N-dimethylaminophenyl)amino-naphthalenediazonium salts, 4-N,N-dimethylamino-naphthalenediazonium salts, 4-N,N-diethylaminonaphthalenediazonium salts, 4-N,N-dibutylamino-naphthalenediazonium salts and the like.

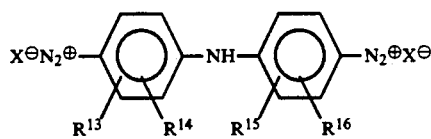

$R^{13}$, $R^{14}$, $R^{15}$ and $R^{16}$ each represent a hydrogen atom, a halogen atom, an alkyl group, an alkenyl group, an alkoxy group, an aryl group, an aralkyl group, an amino group, a dialkylamino group, an alkylmercapto group, an acyl group, a sulfo group or a carboxyl group; and X represents an anion capable of forming a diazonium salt.

In the above formula (V), X has the same meaning as defined in the formula (IV), and $R^{13}$, $R^{14}$, $R^{15}$ and $R^{16}$ each represent a hydrogen atom, a halogen atom, an alkyl, an alkenyl, an alkoxy, an aryl, an aralkyl, an amino, a dialkylamino, an alkylmercapto, an acyl, a sulfo or a carboxyl.

Typical examples represented by the formula (V) may include N,N-bis-(4-diazophenyl)amine, N,N-bis-(3-methoxy4-diazophenyl)amine, N,N-bis-(3-N,N'-dimethylamine-4diazophenyl)amine, N,N-bis-(2,5-dimethoxy-4-diazophenyl)amine, and the like.

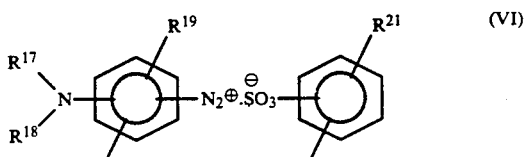

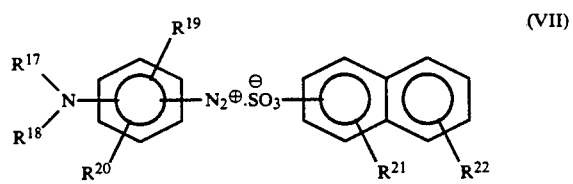

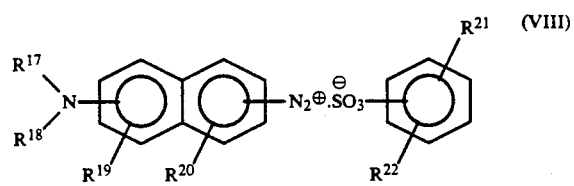

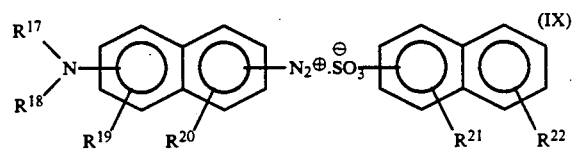

wherein $R^{17}$ and $R^{18}$ each represent a hydrogen atom, an alkyl group having 1 to 6 carbon atoms, a phenyl group, or $R^{17}$ and $R^{18}$ taken together may be cyclized through a carbon, oxygen or nitrogen atom; $R^{19}$ and $R^{20}$ each represent a hydrogen atom, a halogen atom, an alkyl group, an alkoxy group or an alkenyl group each having 1 to 6 carbon atoms; $R^{21}$ and $R^{22}$ each represent a hydrogen atom, a hydroxyl group, a carboxyl group, a sulfo group, an alkyl group or an alkoxy group each having 1 to 6 carbon atoms, an amino group, a nitro group or a benzoyl group.

In $R^{17}$ to $R^{22}$ in the above formulae (VI)–(IX), when they are alkyl groups, alkoxy groups or alkenyl groups, those having carbon atoms greater than 6 are not preferable, because solubility and film forming property of the photosensitive diazonium salt will be lowered.

Examples in which $R^{17}$ and $R^{18}$ are cyclized through carbon, oxygen or nitrogen atom may include, for example, an ethyleneimino group, a trimethyleneimino group, a pyrrolidino group, a piperidino group, a morpholino group, a cycloheptylamino group, and the like.

The photosensitive dizaonium salts represented by the above formulae (VI)–(IX) may be exemplified by 3,4-dimethyl-6-pyrrolidylbenzenediazonium-p-toluenesulfonic acid salts, 3-methoxy-4-pyrrolidylbenzenediazoniumsulfosalicylic acid salts, 2-chloro-6-morpholinobenzenediazonium-p-toluenesulfonic acid salts, 2,5-dibutoxy-4-morpholinobenzenediazoniumnaphthalenesulfonic acid, 4-N,N-dibutylaminobenzenediazonium-p-phenolsulfonic acid, 4-N-phenylamino-naphthalenediazoniumnaphthalenesulfonic acid, 4-N,N-dimethylamino-naphthalenediazoniumsulfosalicylic acid salts, 4-N,N-dibutylaminonaphthalenediazonium-p-toluenesulfonic acid salts and the like.

The reason why the photosensitive diazonium salts represented by the formulae (I)–(IX) are excellently effective in the method of the present invention is in the first place that the absorption band of these diazonium salts exists near 350–450 nm. This means that the g-line (wavelength 436 nm), h-line (wavelength 405 nm) and i-line (wavelength 365 nm) of the light source (mercury lamp) used presently in pattern exposure of an integrated circuit can very effectively be shielded.

Practically, of the diazonium salts used in the field of copying in general, particularly in photosensitive material for microflush or diazo photosensitive paper for copying, even those having absorption band at the longest wavelength region are limited in the absorption peak wavelength to around 405 nm, whereby the light shielding ability against the above g-line is not sufficient. By having a large amount of diazonium salts dissolved in the resin binder, its shielding ability can be increased, but when the dissolving limit is surpassed, the diazonium salt will be crystallized out to give no uniform transparent film.

Accordingly, by use of at least one photosensitive diazonium salts of the formulae (I)–(IX), the above problems can be cancelled, because a wavelength of the absorption peak of these salts coincide with the vicinity of g-line, h-line, i-line or the like.

In the present invention, by further adding 0.5 to 5 moles of sulfonic acid or its derivatives, or phenol, naphthol or their derivatives represented by the following formulae (X)–(XIII) per mole of said diazonium salt in the diazo photosensitive solution, the compatibility of the diazonium salt with the resin binder can be improved.

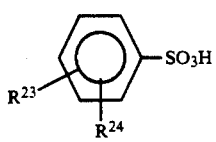

(X)

wherein $R^{23}$ and $R^{24}$ may be either identical or different and each represent a hydrogen atom, a halogen atom, a hydroxyl group, a carboxyl group, an alkyl group, etc.,

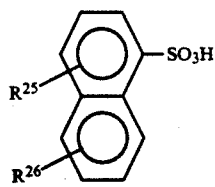

(XI)

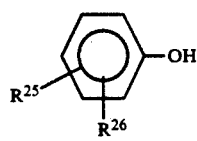

(XII)

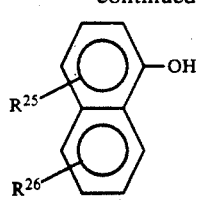

(XIII)

wherein $R^{25}$ and $R^{26}$ may be either identical or different and each represent a hydrogen atom, a halogen atom, a hyroxyl group, a carboxyl group, a sulfo group, an alkyl group having 1 to 5 carbon atoms, an amino group, a nitro group, etc.

The benzenesulfonic acid or its derivatives represented by the formula (X) used in the present invention may include, for example, benzenesulfonic acid, p-toluenesulfonic acid, p-ethylbenzenesulfonic acid, p-hydroxybenzenesulfonic acid, cumenesulfonic acid, dodecylbenzenesulfonic acid and sulfosalicylic acid.

In the above formulae (XI) and (XII), when $R^{25}$ and $R^{26}$ are alkyl groups, they should preferably have 1 to 5 carbon atoms. If the carbon atoms are greater than 5, the solubility of the photosensitive diazonium salt and the film forming property of the photosensitive film will undesirably be lowered.

The naphthalenesulfonic acid derivative represented by the formula (XI) may include, for example, naphthalenesulfonic acid, 1,5-naphthalenedisulfonic acid, 1-naphthol-8-sulfonic acid, 1-naphthol-3,6-disulfonic acid, 1-naphthylamine-4-sulfonic acid and the like.

As the phenol derivative represented by the formula (XII), there may be mentioned, for example, phenol, 4-methylphenol, 4-ethylphenol, 2,6-dimethylphenol, p-tert-butylphenol, phenol-4-sulfonic acid, p-chlorophenol, resorcin, p-aminophenol, salicylic acid, sulfosalicylic acid and the like.

Further, as the naphthol derivative represented by the formula (XIII), there may be mentioned, for example, 1-naphthol, 1,2-naphthalenediol, 1-naphthol-4-carboxylic acid, 2,4-dichloro-1-naphthol, 6-amino-1-naphthol-3-sulfonic acid and the like.

The amount of the compound represented by the formula (X) added may be preferably at a ratio of 0.5 to 5.0 moles, more preferably 0.7 to 1.5 moles per mole of the diazonium salt.

Further, these compounds of the formula (XI), (XII) or (XIII) may be added at a ratio preferably of 0.5 to 5.0 moles, more preferably 0.5 to 2.0 moles, per mole of the diazonium salt. If the amount of these compounds to be added is less than 0.5 mole, the above effect is insufficient, while an amount in excess of 5.0 moles will lower film forming property and resolution of the photosensitive film.

Meanwhile, in the above pattern forming step, even when no sulfonic acid derivative or phenol derivative represented by the above formulae is added in the diazo photosensitive solution, the effect of "having sufficiently greater light shielding ability against UV-rays, having a bleaching speed matching to the sensitizing speed of the resist and giving a substantially transparent film after bleaching" can be obtained. However, by adding a sulfonic acid derivative, phenol derivative or naphthol derivative into the diazo photosensitive solution according to the present invention, the solubility of the diazonium salt under photosensitive solution state and the solubility of under the photosensitive film state (solubility with resin binder) have been found to be dramatically improved. Improvement of the solubility of the diazonium salt under the photosensitive film state means that a large amount of the diazonium salt can be dissolved per unit weight of resin binder, with the result that the UV-ray shielding ability of the diazo photosensitive film can dramatically be improved. According to the present invention, in addition to the above effects, additional effects of "improvement in resolution with little unfocused image, due to the diazo photosensitive member which can be made thinner", and "enlarged scope of applicable diazonium salts", etc. were found to be obtained.

The present inventors have investigated the solubility of various diazonium salts with resin binders. As a result, it was found that the compatibility could not be stated to be so great. For, even according to a combination with good compatibility, the diazonium salt capable of dissolving 1 g of a resin is about 2 mmol. Accordingly, it is very advantageous, if the solubility of the diazonium salt relative to the resin binder can be increased.

In view of the above situation, the present inventors have made various studies on improvement of solubility of the diazonium salt in the resin binder, and consequently found a phenomenon that the solubility of the diazonium salt can be surprisingly improved if a sulfonic acid derivative, phenol derivative or naphthol derivative is added in an amount of 0.5 to 5 moles per mole of the diazonium salt into the diazo photosensitive solution. While the solubility of the diazonium salt in 1 g of a resin binder is about 2 mmol at the highest as mentioned above, according to another embodiment of the present invention which employs a sulfonic acid derivative, phenol derivative or naphthol derivative, about 20 mmol, namely about 10-fold of solubility as compared with the case of no addition, was found to be obtained, and thus it is more preferred.

On the other hand, as the resin binder to be added in the diazo photosensitive solution of the present invention, there may be employed any of water-soluble resins and organic solvent-soluble resins. The water-soluble resins may include polyvinylpyrrolidone, copolymers of vinyl methyl ether and maleic anhydride, polyvinyl alcohol, cellulose derivatives such as methyl cellulose, hydroxymethyl cellulose, hydroxypropyl cellulose, hydroxypropylmethyl cellulose, natural resins such as gelatin, egg white, casein and shellac, etc. Further, the organic solvent soluble resin binders may include cellulose derivatives such as cellulose acetate butyrate resin, cellulose acetate, ethyl cellulose, etc., polyvinylbutyral, polystyrene, cyclized polyisoprene, polyvinyl chloride, polyvinyl acetate, phenolic resins, polyester resin, acrylic resins such as copolymers of methyl methacrylate and methacrylic acid, copolymers of methyl acrylate and acrylic acid, but the present invention is not limited thereto.

The diazonium photosensitive solution may further contain other additives, for example, organic acids such as p-toluenesulfonic acid, sulfosalicylic acid, citric acid, tartaric acid, acetic acid, nicotinic acid, etc. as the pyrolysis stabilizer of the diazonium salt, or surfactants, defoaming agents and others as the materials for improving the coating characteristic, film forming property of the coated films, if desired.

For preparation of the diazo photosensitive solution, the above diazonium salt, the resin binder and the additives are dissolved in an appropriate solvent. Organic solvents may suitably be selected from alcohols, cellosolves, esters, ketones, halogenated hydrocarbons, toluene, xylene, THF and DMF. However, when providing a photosensitive film on a resist film, it is not preferred that a photosensitive solution dissolves or partially dissolves the resist film when the photosensitive solution was provided thereon to form a mixed layer comprising resist materials and a diazonium salt, since the aforesaid fact made lower the resolving property. Therefore, when the resist film consists of a water-soluble resist, the photosensitive solution to be coated thereon should preferably be composed of an organic solvent, a diazonium salt to be soluble therein and a resin binder as main components, and when the resist film consists of an organic solvent-soluble resist, the photosensitive solution to be applied thereon should preferably be composed of water, a water-soluble diazonium salt and a water-soluble resin binder as main components. However, it is not limited to the above when a solvent having substantially no solubility to the resist film is used in the photosensitive solution.

The proportions of the components constituting the diazo photosensitive solution should be such that the proportion of the diazonium salt formulated relative to the resin binder may be as near as possible to the limiting concentration at which the diazonium salt will be crystallized out in the solution state and during formation of the coated film, because the shielding ability against UV-ray can thereby preferably be made greater. In the case of coating by a spinner, etc., the viscosity of the photosensitive solution should desirably be within the range from 5 to 1000 cPs, preferably from 5 to 200 cPs.

The film thickness of the film of the diazo photosensitive solution, which is also related to the light-shielding ability of the film, cannot independently be determined, but it may be generally 500 Å to 5 $\mu$m, preferably 1000 Å to 2 $\mu$m. With a thickness less than 500 Å, pinholes may be generated, while a thickness over 5 $\mu$m will undesirably give rise to unfocused images.

After coating of the diazo photosensitive solution, drying is performed. The drying conditions should be determined primarily in view of the thermal stability of the resist material which is provided under the photosensitive film and the diazonium salt. Since diazonium salts begin to be decomposed usually at around 90° C., the drying time should be made shorter at a temperature of 90° C. or higher. If the solvent remain in the photosensitive film, scattering of the exposure light will be increased, whereby resolution is undesirably lowered.

According to the method of the present invention, after formation of the photosensitive film as described above, pattern exposure is effected by irradiating a light with a wavelength of 300 nm or longer to 450 nm or less. Then, the photosensitive layer is removed, and subsequently the resist layer is developed to give a desired minutely worked pattern.

Further, the present inventors have made various studies about methods for coating of diazo photosensitive solutions on a resist film soluble in a diazo photosensitive solvent. As the result, it has now been found that by providing a transparent thin film which is difficultly soluble in the diazo photosensitive solution on the resist film without dissolving the resist film and applying the diazo photosensitive solution thereon, a diazo photosensitive solution comprising a solvent capable of dissolving the resist film can be used, and further confirmed that provision of such a transparent thin film has no adverse influence on the fading effect of the diazonium salt to give a minute pattern.

For providing the above transparent thin film, there may economically applied the method in which a polymer solution substantially transparent to a light having wavelength from 300 nm or longer to 450 nm or less is subjected to spin coating on a resist film to form a transparent thin film. However, it is required to satisfy the two conditions that said polymer solution must not dissolve substantially the lower layer of the resist film during spin coating, and that the transparent film obtained after drying must not be dissolved in the diazo photosensitive solution during the later step of coating thereof. As the polymer and the solvent system suited for these conditions, there may be employed polymer solutions of rubbery polymers such as cyclized polyisoprene, polybutadiene, neoprene, etc. dissolved in xylene, toluene, benzene, etc. and aqueous solutions of water-soluble polymers such as hydroxypropyl cellulose, methyl cellulose, hydroxypropylmethyl cellulose, polyvinyl alcohol, casein, gelatin, shellac and so on. The thickness of the transparent thin film obtained by spin coating of these polymer solutions should desirably be as thin as possible, but generally 0.03 to 3 $\mu$m, preferably 0.05 to 1 $\mu$m. In the case of a thickness less than 0.03 $\mu$m, pinholes will be formed to lose the meaning of formation of a transparent thin film. On the other hand, a thickness over 3 $\mu$m will undesirably give rise to unfocused images.

In the case of forming an intermediate layer comprising the above transparent thin film, the following effects can be obtained:

a) solvents of the diazo photosensitive solution can be selected without depending upon a kind of the resist film provided thereunder, thus variety kinds of diazonium salt can be used;
b) film thickness of the diazo photosensitive film can easily be controlled in the coating step;
c) removal of impurities in the diazo photosensitive solution can easily be done.

For forming a pattern on a substrate on which a photosensitive film having been formed a transparent thin film between a resist film and the photosensitive film has been formed, after pattern exposure, the diazo photosensitive film and the transparent thin film are peeled off in the order mentioned, and finally the resist film is subjected to development. For peeling off the diazo photosensitive film and the transparent thin film, the solvents employed for preparation of respective coating solutions are generally employed.

According to the present invention, there can be obtained an excellent effect that a minute pattern of 1 $\mu$m or less can be formed according to a simple method, while utilizing effectively the UV-ray exposure technique of the prior art, with good dimensional precision and stability, and its industrial effect is great.

The present invention is described in detail by referring to the following Examples.

EXAMPLE 1

On a silicon wafer was provided a positive-type resist [esterified product of 1,2-naphthoquinone-diazide-5-sulfonic acid dissolved in m-cresol novolac resin (trade name OFPR-800, produced by Tokyo Oka Kogyo K.K.)] with a film thickness of 1 $\mu$m.

Next, a diazo photosensitive solution comprising the composition shown below was applied by rotary coating on the above positive-type resist, followed by drying at 80° C. for 10 minutes to provide a diazo photosensitive film with a thickness of 0.4 $\mu$m.

| | |
|---|---|
| 2,5-Diethoxy-4-morpholinobenzene-diazonium chloride ½ zinc chloride double salt (MW 382) | 20 mmol |
| Polyvinyl pyrrolidone (trade name: K90, produced by GAF Co.) | 10 g |
| Pure water | 200 ml |

COMPARATIVE EXAMPLE 1

On the other hand, a comparative sample was prepared in the same manner as in Example 1 except that only the positive-type photoresist film was used.

Then, the sample thus obtained according to the present invention and the sample for comparative purpose were compared with each other with respect to their effects according to the following method.

The dimensions of the resist pattern after development when a pattern of 1 $\mu$m was exposed with various exposure second by means of a reduction-type projection aligner mounted with a 10:1 reducing lens with a numerical aperture of 0.35 were measured. The results are shown in FIG. 1 wherein the marks —●— represent the results of the present invention and the marks —○— those of Comparative example (the same as herein), which shows that the exposure second for obtaining a line width of 1 $\mu$m is prolonged to 2 seconds by use of the structure of the present invention, as contrasted to the prior art in which it is about 0.4 sec. However, examination of the dependency of line width on the exposure time after development gives the result that the slope of the straight line is about ½ in the structure of the present invention as compared with the Comparative example, and therefore it can be understood that controllability of dimensions is greatly improved.

Figure 2:
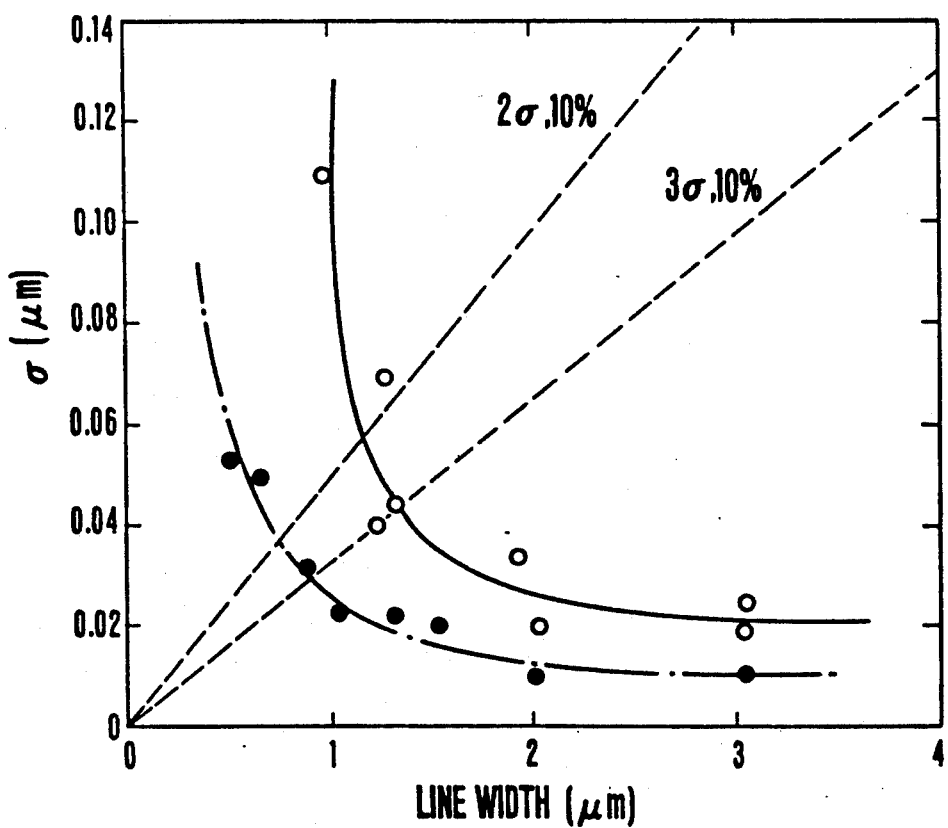

Also, the results of comparison with respect to dimensional precision are shown in FIG. 2. The dimensional precision ordinarily required is 3 $\sigma$, and it is stated to be within 10% of its dimension. To determine the minimum line width, it is about 1.2 $\mu$m in the prior art method, and about 0.9 $\mu$m in the method of the present invention. Thus, improvement to a great extent can be recognized.

EXAMPLE 2

The same experiment as in Example 1 was conducted except for employing 2,5-diethoxy-4-p-methoxyphenylthiobenzenediazonium chloride ½ zinc chloride double salt in place of the diazonium salt employed in Example 1, and the same pattern of 0.9 $\mu$m in the line width as in Example 1 was obtained.

EXAMPLE 3

When the same experiment as in Example 1 was conducted except for employing the photosensitive solution having the following composition in place of the diazo photosensitive solution employed in Example 1, a clear pattern of 0.9 $\mu$m in the line width was obtained. The viscosity of the diazo photosensitive solution was 50 cPs.

| | |
|---|---|
| 2,5-Diethoxy-4-p-methoxybenzoylamino-benzenediazonium chloride ½ zinc double salt | 20 mmol |

| | |
|---|---|
| Copolymer of vinyl methyl ether and maleic anhydride (trade name: GANTREZ AN-139, produced by GAF Co.) | 10 g |
| Pure water | 200 ml |

EXAMPLE 4

The same experiment as in Example 3 was conducted except for employing 3-methoxy-4-pyrrolidinylbenene chloride ½ zinc chloride double salt as the diazonium salt in the diazo photosensitive solution employed in Example 3. As the result, a clear pattern of 0.8 to 0.9 μm in the line width was obtained.

COMPARATIVE EXAMPLE 2

The following mixture was prepared as a solution containing a fading dye.

| | |
|---|---|
| Rhodamine 6G | 10 mmol |
| Polyvinylpyrrolidone (trade name: K-90, produced by GAF Co.) | 10 g |
| Pure water | 200 ml |

This dye solution was applied on the positive-type resist film as employed in Example 1 to provide a dye film with a dried film thickness of 0.7 μm. By varying the exposure time similarly as in Example 1, patterns were evaluated. As the result, it proved to take unpractically long time of 16 minutes or longer for obtaining a pattern of 1 μm.

COMPARATIVE EXAMPLE 3

On a silicon wafer was provided an ordinary negative-type resist [2,6-bis-(4-azidobenzal)cyclohexanone derivative dissolved in cyclized polyisoprene (trade name: OMR-83, produced by Tokyo Oka K.K.)]with a film thickness of 1.0 μm. Next, the positive-type resist as used in Example 1 was applied on the resist film to a thickness of 0.5 μm. Exposure was effected by means of a projection aligner mounted with 1 : 1 mirror (trade name: PLA-520, produced by Canon K.K.). Exposure was effected by varying the exposure time, and the positive-type resist was removed with cellosolve acetate after exposure, followed by developing with a xylene type developer, and the patterns obtained were evaluated. As the result, it was found that no minute pattern of 2.0 μm or less was obtained irrespectively of whether there was the positive-type resist film or not.

EXAMPLE 5

On a silicon wafer was provided a positive-type resist (trade name: OFPR-800, produced by Tokyo Oka Kogyo K.K.) with a film thickness of 1 μm.

Next, a diazo photosensitive solution comprising the composition shown below was applied by rotary coating on the above positive-type resist, followed by drying at 80° C. for 10 minutes to provide a diazo photosensitive film with a thickness of 0.4 μm.

| | |
|---|---|
| 3,4-Dimethyl-6-pyrrolidylbenzene diazonium chloride ½ zinc chloride double salt (absorption peak wavelength: 440 nm) | 20 mmol |
| Polyvinylpyrrolidone (trade name: K-90, produced by GAF Co.) | 10 g |
| Pure water | 200 ml |

COMPARATIVE EXAMPLE 4

Figure 3:
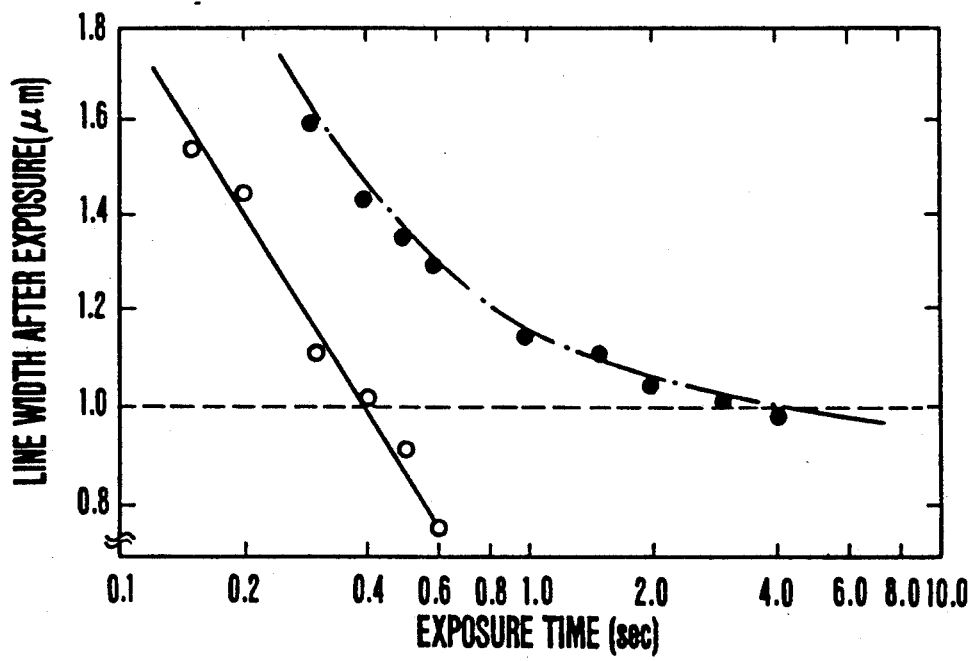

A sample was prepared according to entirely the same procedures except for forming no diazo photosensitive film. The sample obtained of the present invention and the comparative sample were subjected to measurement of their effects according to the method as described in Example 1. FIG. 3 shows the results of measurement of the dimensions of resist patterns after development. In the prior art method, the exposure second for obtaining a line width of 1 μm is about 0.4 second, while it is prolonged to 4 seconds according to the present invention. However, examination of the dependency of the line width on the exposure time after development gives the result that the slope of the straight line is about ⅓ to ¼ as compared with the prior art method, thus indicating that the dimensional stability is greatly improved in the present invention.

Figure 4:
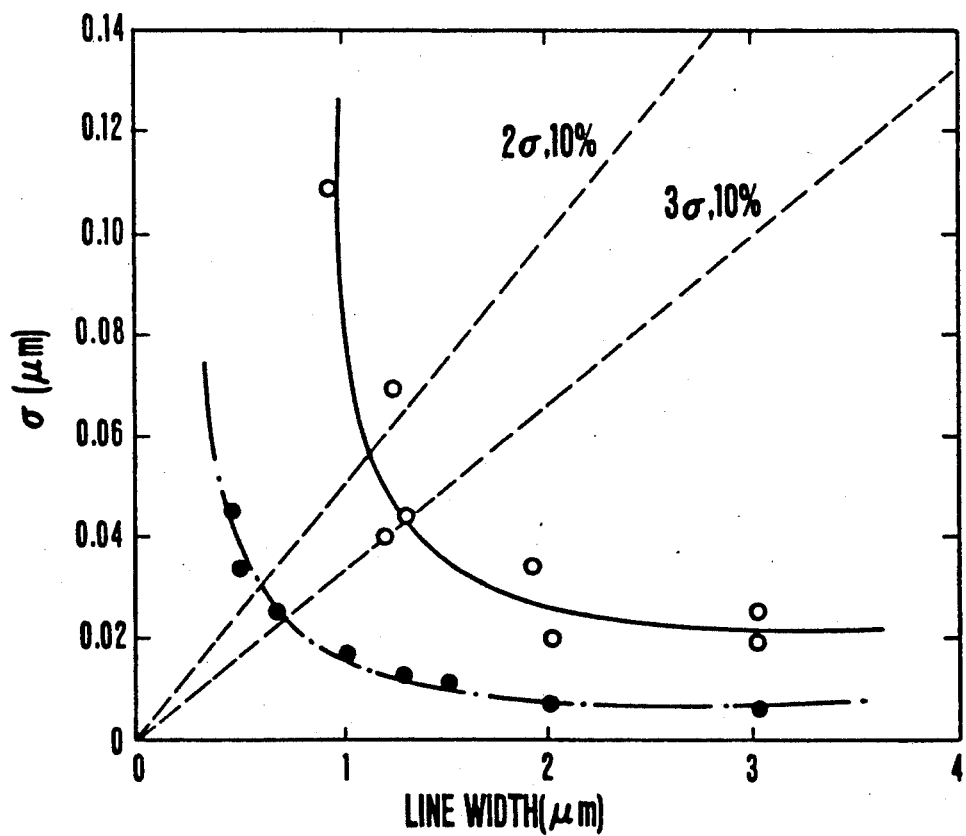

Also the results of comparison with respect to dimensional stability are shown in FIG. 4, in which improvement to a great extent can be seen such that the minimum line width in the present invention is 0.7 μm as contrasted to 1.2 μm in the prior art method.

EXAMPLE 6

In place of the diazonium salt employed in Example 5, 3,4-dimethyl-6-morpholinobenzenediazonium chloride ½ zinc chloride double salt (absorption peak wavelength: 445 nm) was employed, following otherwise the same conditions as in Example 5, to carry out the experiment. As the result, a pattern of 0.7 μm was obtained similarly as in Example 5.

EXAMPLE 7

In place of the diazo photosensitive solution employed in Example 5, the solution having the composition shown below was used, following otherwise the same conditions as in Example 5, to obtain a clear pattern of 0.8 μm.

| | |
|---|---|
| 2-(N,N-dimethylamino)-5-methylthiobenzene-diazonium chloride ½ zinc chloride double salt (absorption peak wavelength: 450 nm) | 20 mmol |
| Copolymer of vinyl methyl ether and maleic anhydride (trade name: GANTREZ AN-139, produced by GAF Co.) | 10 g |
| Pure water | 200 ml |

EXAMPLE 8

Except for employing the composition shown below as the diazo photosensitive solution, patterns were formed in the same manner as in Example 1. As the result, the exposure seconds for obtaining a line width of 1 μm were 3 seconds. Also, when dependency of the line width on the exposure time after development and the dimensional precision were measured, results similar to those obtained in Example 5 were obtained.

| | |
|---|---|
| 4-α-Naphthylaminobenzenediazonium chloride ½ zinc chloride double salt (absorption peak wavelength: 435 nm) | 20 mmol |
| Polyvinylpyrrolidone (trade name: K-90, | 10 g |

| | |
|---|---|
| produced by GAF Co.) | |
| Pure water | 200 ml |

EXAMPLE 9

The same experiment as in Example 8 was conducted except for employing 4-β-naphthylaminobenzenediazonium chloride ½ zinc chloride double salt in place of the diazonium salt employed in Example 8. As the result, a pattern of 0.8 μm in the line width was obtained similarly as in Example 8.

EXAMPLE 10

The same experiment as in Example 8 was conducted except for replacing the diazo photosensitive solution employed in Example 8 with the photosensitive solution as shown below to obtain a clear pattern of 0.8 μm in the line width.

| | |
|---|---|
| 4,6'-Sodium sulfonate-β-naphthylamino-benzenediazonium chloride ½ zinc chloride double salt (absorption wavelength: 465 nm) | 20 mmol |
| Copolymer vinyl methyl ether and maleic anhydride (trade name: GANTREZ AN-139, produced by GAF Co.) | 10 g |
| Pure water | 200 ml |

EXAMPLE 11

On a silicon wafer was formed a positive-type resist (trade name: OFPR-800, produced by Tokyo Oka K.K.) to a film thickness of 1 μm.

Next, by use of a 5 % xylene solution of cyclized polyisoprene, a transparent thin film with a thickness of 0.1 μm was formed according to the rotary coating method on the above resist film. Next, a diazo photosensitive solution having the composition shown below was prepared, and the photosensitive solution was applied according to the rotary coating method to provide a diazo photosensitive film with a film thickness of 0.4 μm on the above transparent thin film.

For the thus prepared sample, patterns were formed following the method as described in Example 1. As the result, the exposure time for obtaining a pattern with a 1 μm line width was 2 seconds. On the other hand, the minimum line width satisfying the dimensional precision was 3 σ, and the condition within 10% was found to be about 0.9 μm, which was by far superior to 1.2 μm of the prior art comprising only the positive-type resist.

EXAMPLE 12

By use of 2,5-diethoxy-4-morpholinobenzenediazonium tetrafluoroborate (absorption peak wavelength: 404 nm) in place of the diazonium salt employed in Example 11, patterns were formed in the same manner as in Example 11. As the result, a pattern of 0.9 μm was obtained.

EXAMPLE 13

As the result of formation of the patterns according to the same method as in Example 11 by use of the photosensitive solution having the composition as shown below as the diazo photosensitive solution, a clear pattern of 0.8 μm could be obtained.

| | |
|---|---|
| 3-Methoxy-4-pyrrolidinylbenzene-diazonium tetrafluoroborate (absorption peak wavelength: 411 nm) | 20 mmol |
| Polyvinylbutyral resin (trade name: Ethlec BMS, produced by Sekisui Kagaku K.K.) | 10 g |
| Mixed solvent of cellosolve acetate: methyl ethyl ketone = 8:2 | 200 ml |

EXAMPLE 14

The same experiment as in Example 11 was repeated by use of an aqueous 10 % solution of hydroxypropyl cellulose as the polymer solution for formation of a transparent thin film. As the result, a clear pattern with the minimum line width of 0.9 μm was obtained.

EXAMPLE 15

On the resist film of a positive-type resist (trade name OFPR-800, produced by Tokyo Oka K.K.) formed on a silicon wafer to a film thickness of 1 μm, a transparent thin film with a film thickness of 0.1 μm was provided by use of a 5% xylene solution of a cyclized polyisoprene.

Next, a diazo photosensitive solution having the composition shown below was prepared and applied on the above transparent thin film according to the rotary coating method to a film thickness of 0.4 μm. The viscosity of the photosensitive solution was 30 cPs. When patterns were formed following Example 1, the exposure time for obtaining a pattern with a line width of 1 μm was about 4 seconds. Also, the minimum line width satisfying the dimensional precision of 3 σ, and the condition within 10% was about 0.7 μm.

| | |
|---|---|
| 2,5-Dibutoxy-4-morpholinobenzene diazonium tetrafluoroborate | 100 mmol |
| p-Toluene solfonic acid | 100 mmol |
| Cellulose butyroacetate | 10 g |
| Mixed solvent of cellosolve acetate: methyl ethyl ketone = 8:2 in volume ratio | 200 ml |

EXAMPLE 16

As the result of pattern formation conducted in the same manner as in Example 15 by use of 2,5-diethoxy-4-morpholinobenzenediazonium tetrafluoroborate (absorption peak wavelength: 404 nm) as the diazonium salt, a pattern of 0.7 μm in the line width was obtained.

EXAMPLE 17

As the result of pattern formation in the same manner as in Example 15 by use of the diazo photosensitive solution having the composition shown below, a clear pattern of 0.7 μm in the line width was obtained.

| | |
|---|---|
| 3-Methoxy-4-pyrrolidylbenzenediazonium tetrafluoroborate (absorption peak wavelength: 411 nm) | 200 mmol |
| p-Hydroxybenzenesulfonic acid | 230 mmol |
| Polyvinylbutyral resin (trade name: Ethlec BMS, produced by Sekisui Kagaku K.K.) | 10 g |
| Mixed solvent of cellosolve acetate: methyl ethyl ketone = 8:2 in volume ratio | 200 ml |

EXAMPLE 18

The same experiment as in Example 15 was carried out by use of an aqueous 10 % solution of hydroxypropyl cellulose as the polymer solution for formation of a transparent thin film. As the result, a clear pattern with the minimum line width of 0.7 μm was obtained.

EXAMPLE 19

On the positive-type resist of Example 15 was applied a diazo photosensitive solution having the following composition to provide a diazo photosensitive film with a film thickness of 0.4 μm thereon.

| | |
|---|---|
| 2,5-Diethoxy-4-morpholinobenzene-diazonium chloride ½ zinc chloride double salt | 200 mmol |
| p-Toluenesulfonic acid | 230 mmol |
| Polyvinylpyrrolidone (trade name: K-90, produced by GAF Co.) | 10 g |
| Pure water | 200 ml |

Thereafter, similarly as in Example 15, pattern formation was performed to obtain a clear pattern of 0.7 μm in the line width.

EXAMPLE 20

On a silicon wafer was provided a positive-type resist esterified product of 1,2-naphthoquinone-diazide-5-sulfonic acid dissolved in m-cresol novolac resin (trade name: OFPR-800, produced by Tokyo Oka Kogyo K.K.)] with a film thickness of 1 μm.

Next, a diazo photosensitive solution comprising the composition shown below was applied by rotary coating on the above positive-type resist, followed by drying at 80° C. for 10 minutes to provide a diazo photosensitive film with a thickness of 0.4 μm.

| | |
|---|---|
| 2-(4'-Methoxyphenyl)-6-methyl-1,3-benzotriazole-5-diazonium tetrafluoroborate | 20 mmol |
| Polystryrene (Mw = 40000) | 10 g |
| Xylene | 200 ml |

Figure 5:
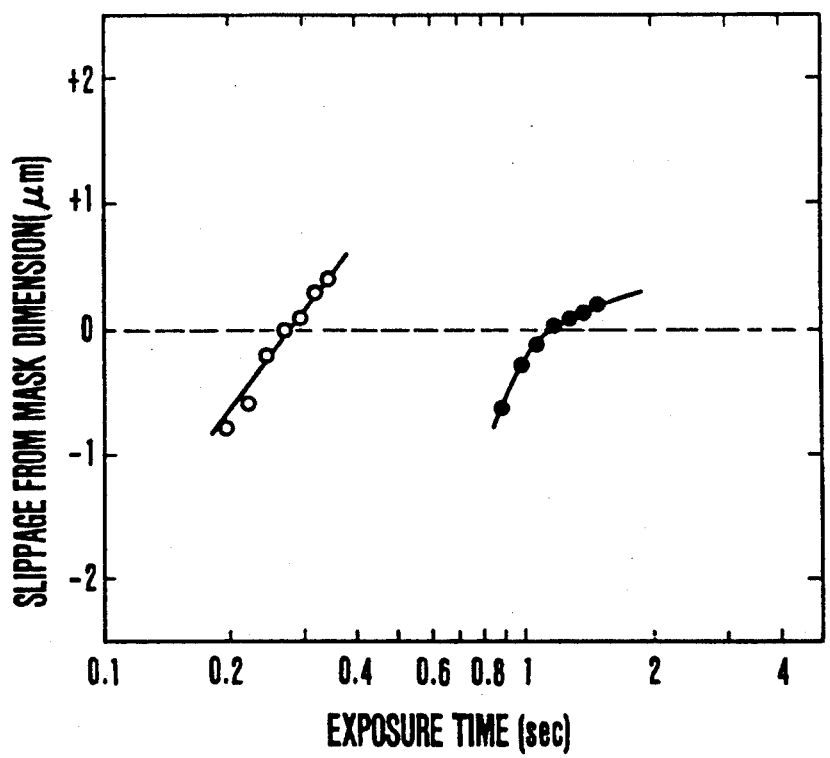

Then, on this photosensitive film, a pattern of 1.2 μm was exposed by means of a reduction-type projection aligner mounted with a 10 : 1 reducing projecting lens with a numerical aperture of 0.35 by varying the exposure seconds. The results of measurement of the dimensions of the resist patterns after development are shown in FIG. 5. For comparative purpose, the results when no photosensitive film was provided were also shown together.

As apparently seen from FIG. 5, the dependency of the line width on the exposure time after development gives the result that the slope of the straight line is about ⅓ in the structure of the present invention as compared with the case of Comparative example, and therefore it has been found that controllability of pattern dimensions is greatly improved.

Also, when comparison was made with respect to resolution, it was found that the minimum line width which can maintain good cross-sectional shape of pattern was 0.7 μm in the case of Example, as contrasted to 1.0 μm of Comparative example.

EXAMPLE 21

Pattern formation was carried out in the same manner as in Example 20 except for employing a photosensitive solution having the composition shown below.

| | |
|---|---|
| 2-Naphthyl-1,3-benzotriazole-5-diazonium-hexafluorophosphate | 20 mmol |
| Cyclized polyisoprene (unsaturation degree: 6 mmol/g) | 10 g |
| Xylene | 200 ml |

As the result, a clear pattern of 0.8 μm in the line width was obtained.

EXAMPLE 22

On a silicon wafer was provided a positive-type resist [esterified product of 1,2-naphthoquinone-diazide-5-sulfonic acid dissolved in m-cresol novolac resin (trade name: OFPR-800, produced by Tokyo Oka Kogyo K.K.)] to a film thickness of 1 μm.

Next, a diazo photosensitive solution comprising the composition shown below was applied by rotary coating on the above positive-type resist, followed by drying at 80° C. for 10 minutes to provide a diazo photosensitive film with a thickness of 0.4 μm.

| | |
|---|---|
| 4-N-phenylaminonaphthalenediazonium-hexafluorophosphate | 20 mmol |
| Cellulose butyroacetate | 5 g |
| Trichloroethane | 200 ml |

COMPARATIVE EXAMPLE 5

A sample was prepared according to entirely the same procedure as in Example 22 except for providing no diazo photosensitive film.

Then, the sample thus obtained according to the present invention and the sample comprising only the positive-type resist film were compared with each other with respect to their effects according to the following method.

Figure 6:
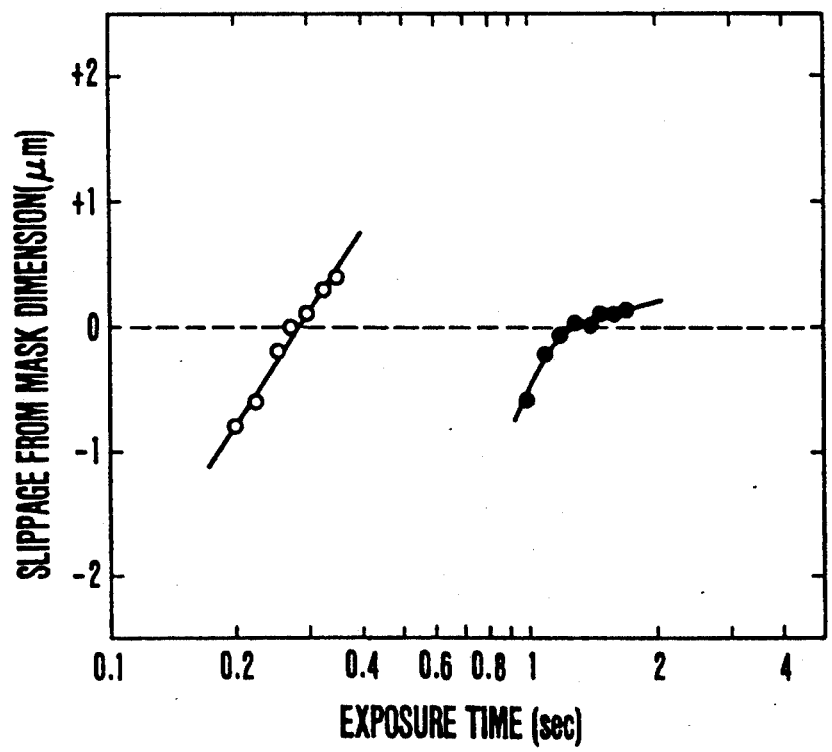

The dimensions of the resist pattern after development when a pattern of 1.2 μm was exposed (wavelength: 436 nm) for various exposure seconds by means of a reduction-type projection aligner mounted with a 10:1 reducing lens with a numerical aperture of 0.35 were measured. The results are shown in FIG. 6.

It is shown that the exposure second for obtaining a line width of 1.2 μm is prolonged to 1.3 seconds by use of the structure of the present invention, as contrasted to the nation of the dependency of line width on the exposure time after development gives the result that the slope of the straight line is about ⅓ with smaller deviation from the mask dimension in the structure of the present invention as compared with the Comparative example, and therefore it can be understood that controllability of dimensions is greatly improved.

Also, as the result of comparison with respect to resolution, it was found that the minimum line width which can maintain good cross-sectional shape of pattern was 0.7 μm in the case of Example, as contrasted to 1.0 μm of Comparative example. Thus, improvement to a great extent was observed in the present invention.

EXAMPLE 23

The same experiment as in Example 22 was carried out except for using the diazo photosensitive solution having the composition shown below. As the result, a clear pattern having a line width of 0.8 μm was obtained.

| | |
|---|---|
| 4-N-(2',5'-dimethoxyphenyl)amino-naphthalenediazonium tetrafluoroborate | 20 mmol |
| Polystyrene (Mw = 40000) | 10 g |
| Xylene | 200 ml |

EXAMPLE 24

In the same manner as in Example 22 except for using the diazo photosensitive solution having the composition shown below, a diazo photosensitive film was provided on the positive-type resist.

| | |
|---|---|
| N,N-bis-(4-diazophenyl)amine tetrafluoroborate | 20 mmol |
| Polystyrene (Mw = 10000) | 10 g |
| Xylene | 200 ml |

COMPARATIVE EXAMPLE 6

A sample was prepared according to entirely the same procedure as in Example 22 except for providing no diazo photosensitive film.

Figure 7:
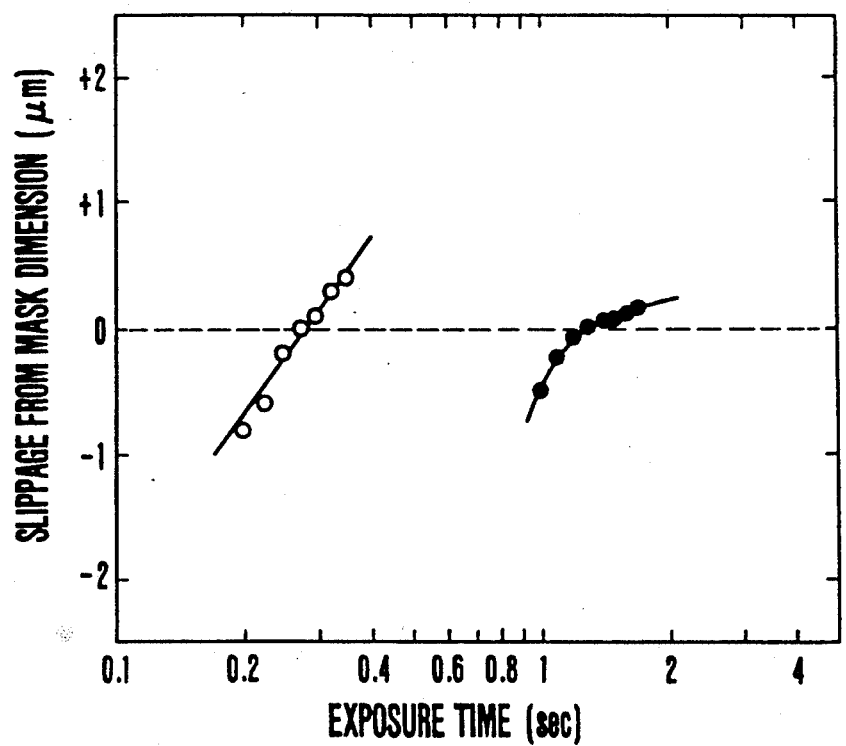

Then, the sample thus obtained according to the present invention and the sample comprising only the positive-type photoresist film were compared with each other with respect to their effects according to the same method as in Example 22 to obtain the results as shown in FIG. 7.

It is shown that the exposure second for obtaining a line width of 1.2 μm is prolonged to 1.3 seconds by use of the structure of the present invention, as contrasted to the prior art in which it is about 0.3 sec. However, examination of the dependency of line width on the exposure time after development gives the result that the slope of the straight line is about ⅓ with smaller deviation from the mask dimension in the structure of the present invention as compared with the Comparative example, and therefore it can be understood that controllability of dimensions is greatly improved.

Also, as the result of comparison with respect to resolution, it was found that the minimum line width which can maintain good cross-sectional shape of pattern was 0.7 μm in the case of Example, as contrasted to 1.0 μm of Comparative example. Thus, improvement to a great extent was observed in the present invention.

EXAMPLE 25

The same experiment as in Example 24 was carried out except for using the diazo photosensitive solution having the composition shown below. As the result, a clear pattern having a line width of 0.7 μm was obtained.

| | |
|---|---|
| N,N-bis-(3-methoxy-4-diazophenyl)-amine tetrafluoroborate | 20 mmol |
| Alkyl-modified phenol novolac resin (trade name: CKM-2400, produced by Showa Union Gosei Co.) | 10 g |
| Xylene | 200 ml |

EXAMPLE 26

On a silicon wafer was provided a positive-type resist film [esterified product of 1,2-naphthoquinone-diazide-5-sulfonic acid dissolved in m-cresol novolac resin (trade name: OFPR-800, produced by Tokyo Oka Kogyo K.K.)] to a film thickness of 1.2 μm.

Next, a diazo photosensitive solution comprising the composition shown below was applied by rotary coating on the above positive-type resist film, followed by drying at 80° C. for 10 minutes to provide a diazo photosensitive film with a thickness of 0.5 μm.

| | |
|---|---|
| 3-Methoxy-4-pyrrolidylbenzenediazonium-sulfosalicylic acid salt | 20 mmol |
| Cellulose acetate | 5 g |
| Trichloroethane | 200 ml |

COMPARATIVE EXAMPLE 7

A sample was prepared according to entirely the same procedure as in Example 26 except for providing no diazo photosensitive film.

Then, the sample thus obtained according to the present invention and the sample comprising only the positive-type photoresist film were compared with each other with respect to their effects according to the following method.

The dimensions of the resist pattern after development when a pattern of 1.2 μm was exposed (wavelength: 436 nm) for various exposure seconds by means of a reducing projecting exposure device mounted with a 10:1 reducing projecting lens with a numerical aperture of 0.35 were measured. The results are shown in FIG. 8.

Figure 8:
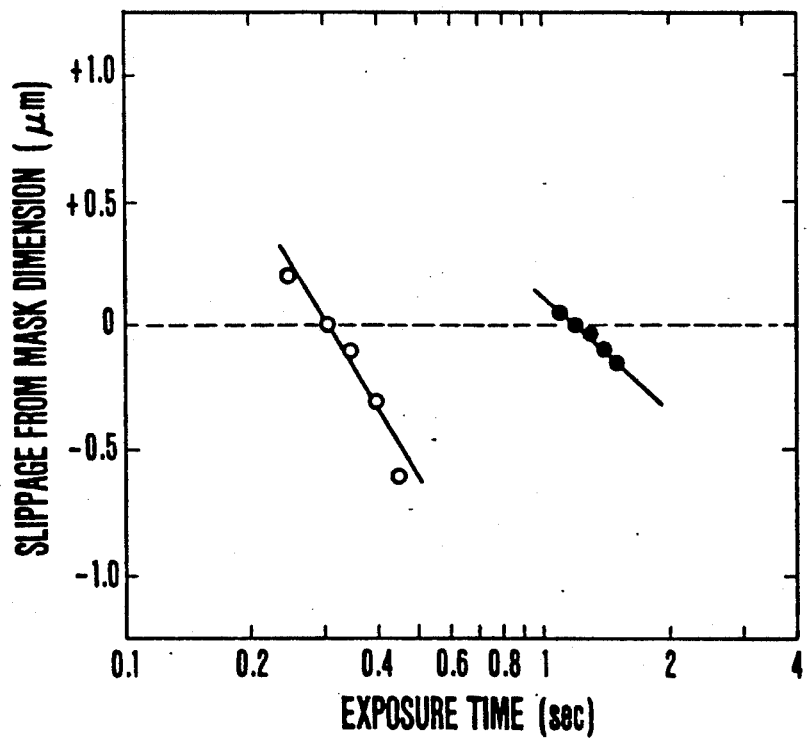

As apparently seen from FIG. 8, the exposure second for obtaining a line width of 1.2 μm is prolonged to about 1.2 seconds by the present invention, as contrasted to the prior art in which it is about 0.3 sec. Also, examination of the dependency of line width on the exposure time after development gives the result that the slope of the straight line is about ¼ with smaller deviation from the mask dimension in the present invention as compared with the Comparative example, and therefore it can be understood that controllability of dimensions is greatly improved.

Also, as the result of comparison with respect to resolution, it was found that the minimum line width which can maintain good cross-sectional shape of pattern was 0.6 μm in the case of Example, as contrasted to 1.0 μm of Comparative example. Thus, improvement to a great extent was confirmed in the present invention.

EXAMPLE 27

On a silicon wafer was provided a positive-type resist esterified product of 1,2-naphthoquinone-diazide-5-sulfonic acid dissolved in m-cresol novolac resin (trade name: OFPR-800, produced by Tokyo Oka Kogyo K.K.)] to a film thickness of 1.2 μm.

Next, a diazo photosensitive solution comprising the composition shown below was applied by rotary coating on the above positive-type resist, followed by drying at 80° C. for 10 minutes to provide a diazo photosensitive film with a thickness of 0.4 μm.

| | |
|---|---|
| 2,5-Diethoxy-4-morpholinobenzene-diazonium tetrafluoroborate | 60 mmol |
| p-tert-Butylphenol | 50 mmol |
| Alkyl-modified phenol novolac resin (trade name: KM-2400, produced by Showa Union Gosei Co.) | 10 g |
| Xylene | 200 ml |

Then, the photosensitive film was exposed by means of a reduction-type projection aligner mounted with a 10:1 reducing lens with a numerical aperture of 0.35 and, after development, the resist pattern was observed. For comparison, the same exposure was carried out also in the case of providing no photosensitive film of the present invention. As the result, in the case of the sample of the present invention, a pattern of 0.8 μm could be resolved, and the cross-sectional shape of the pattern was also found to be very good. In contrast, in the case of Comparative example, the resolution was 1.2 μm.

EXAMPLE 28

On a silicon wafer was provided a positive resist obtained by dissolving esterified product of 1,2-naphthoquinone-diazide-5-sulfonic acid and m-cresol novolac resin in a solvent (trade name OFPR-800, produced by Tokyo Oka Kogyo K.K.) by rotary coating and drying to form a resist film with a film thickness of 1.5 μm.

Next, a photosensitive solution comprising the composition shown below was applied by rotary coating on the above positive=type resist, followed by drying at 70° C. for 60 seconds to provide a photosensitive film with a thickness of 0.3 μm.

| | |
|---|---|
| 4-N,N-dimethylaminonaphthalene-diazonium-p-toluene sulfonate | 40 mmol |
| p-Toluenesulfonic acid | 40 mmol |
| Copolymer of Vinylmethyl ether-maleic anhydride (trade name: GANTREZ AN-169, produced by GAF Co.) | 10 g |
| Polyoxyethylenenonylphenyl ether type surfactant (trade name: Noygen EA-120, produced by Daiichi Kogyo Seiyaku K.K.) | 1 g |
| Pure water | 200 ml |

COMPARATIVE EXAMPLE 8

On the other hand, comparative example was prepared in the same manner as in Example 28 except that only the positive-type photoresist film was provided.

Then, the samples thus obtained according to the present invention and comparative purpose were subjected to exposure by means of a reduction-type projection aligner mounted with a 5 : 1 reducing projecting lens with a numerical aperture of 0.35 and a wavelength of 436 nm, and developed to form a resist pattern, respectively. These resist patterns were observed by scanning electron microscope to measure definition thereof. As the results, it was found that the minimum line width which can maintain good cross-sectional shape of pattern was 0.7 μm in the case of Example 28, as contrasted to 1.2 μm of Comparative example 8. Thus, it can be confirmed that extremely fine resist pattern can be formed in the present invention.

EXAMPLE 29

On a quartz wafer provided thereon an aluminum film with a thickness of 0.1 μm by the deposition method was provided a positive-type resist (trade name: NPR 1512, produced by Nagase Sangyo K.K.) containing dye by the rotary coating and drying to form a resist film with a film thickness of 0.8 μm.

Next, a photosensitive solution comprising the composition shown below was applied by rotary coating on the above positive-type resist to provide a photosensitive film with a thickness of 0.2 μm.

| | |
|---|---|
| 4-N,N-dimethylaminonaphthalene-diazonium-p-toluene sulfonate | 40 mmol |
| p-Toluenesulfonic acid | 40 mmol |
| Copolymer of Vinylmethyl ether-maleic anhydride (trade name: GANTREZ AN-169, produced by GAF Co.) | 10 g |
| Polyoxyethylenenonylphenyl ether type surfactant (trade name: Noygen EA-120, produced by Daiichi Kogyo Seiyaku K.K.) | 1 g |
| Pure water | 200 ml |

COMPARATIVE EXAMPLE 9

On the other hand, comparative example was prepared in the same manner as in Example 29 except that only the positive-type photoresist film was provided.

Then, the samples thus obtained according to the present invention and comparative purpose were subjected to exposure by means of a reduction-type projection aligner mounted with a 5 : 1 reducing projecting lens with a numerical aperture of 0.35 and a wavelength of 436 nm, through an electrode pattern of a surface acoustic wave device. After forming a resist pattern by development, an aluminum portion exposed was eliminated by etching, and further the resist pattern was eliminated by dissolving using a solvent to form a comb type electrode on the crystal wafer having a line width of 1.15 μm comprising aluminum.

Electric characteristics of the thus prepared surface acoustic wave device were tested and fraction of defective unit was measured. As the results, it was found that fraction defective of the samples of Example 29 were 8%, as contrasted to 25% of Comparative example 9. This shows that precise resist pattern was formed in the present invention so that etching of aluminum can be carried out precisely. To the contrary, in the samples of Comparative example 9, precise resist pattern was not formed whereby residue of the resist is likely generated at opening of the pattern and etching of aluminum cannot be practiced precisely.

EXAMPLE 30

On a silicon wafer was provided a positive-type resist (trade name, ONPR-800HS, produced by Tokyo Oka Kogyo K.K.) to a film thickness of 1.5 μm.

Next, a photoresistive solution comprising the composition shown below was prepared and applied by rotary coating on the above positive-type resist to provide a photosensitive film with a thickness of 0.5 μm.

| Photosensitive solution - A | |
|---|---|
| 2,5-Diethoxy-4-morpholinobenzene-diazonium p-toluenesulfonate | 40 mmol |
| p-tert-Butylphenol | 50 mmol |
| Alkyl-modified phenol novolac resin | 10 g |

| | |
|---|---|
| (trade name: CKM-2400, produced by Showa Union Gosei Co.) | |
| Xylene | 200 ml |
| Photosensitive solution - B | |
| 4-Diazo-diphenylaniline-p-toluene-sulfonate | 40 mmol |
| p-tert-Butylphenol | 100 mmol |
| Alkyl-modified phenol novolac resin (trade name: CKM-2400, produced by Showa Union Gosei Co.) | 10 g |
| Xylene | 200 ml |

COMPARATIVE EXAMPLE 10

As the comparative example, on a positive-type resist was formed a barrier layer (trade name: CEM-BC5, produced by GE Co.) with a thickness of 0.2 $\mu$m, and then CEL material (trade name: CEM-388) was applied with a thickness of 0.5 $\mu$m.

Figure 9:
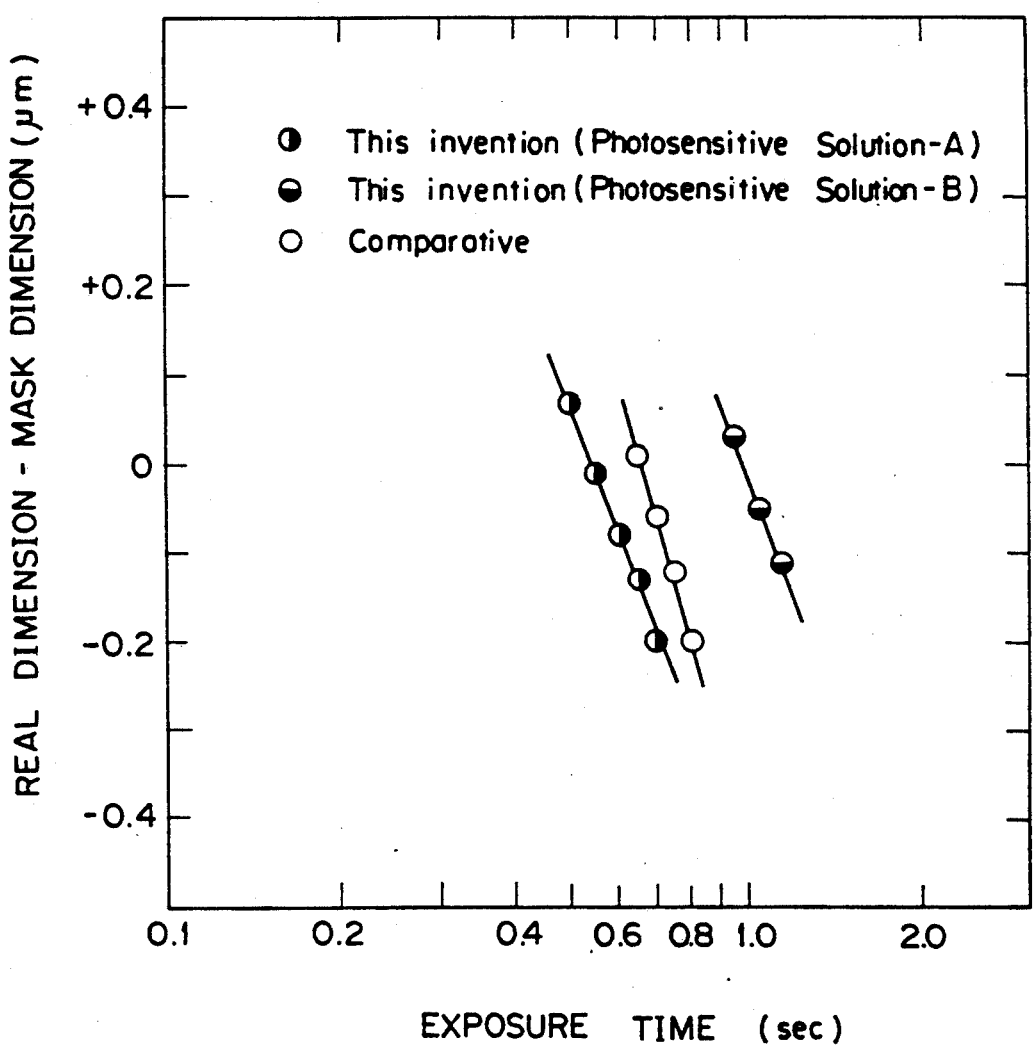

Then, the samples thus obtained according to the present invention and comparative purpose were subjected to exposure by means of a reduction-type projection aligner mounted with a 10 : 1 reducing projecting lens with a numerical aperture of 0.35 and a wavelength of 365 nm (i line), and developed to form a resist pattern, respectively. These resist patterns were observed by scanning electron microscope to measure resolution thereof. As the results, samples of the present invention and the comparative example were both resolved patterns of 0.7 $\mu$m, respectively. However, examination of the dependency of line width on the exposure time regarding 0.8 $\mu$m pattern after development gives the result that the slope of the straight line is about ⅔ in the structure of the present invention as compared with the comparative sample (the results are shown in FIG. 9), and therefore it can be understood that controllability of dimensions is excellent in the present invention.

Also, in the case where CEL material of GE Co. was formed directly on the resist without forming a barrier layer, mixing of the both components was occurred at the interface of the resist layer and the CEL layer so that formation of a pattern cannot be done.

EXAMPLE 31

On a silicon wafer was provided a positive-type resist [esterified product of 1,2-naphthoquinone-diazide-5-sulfonic acid dissolved in m-cresol novolac resin (trade name: OFPR-800, produced by Tokyo Oka Kogyo K.K.)] with a film thickness of 1 $\mu$m.

Next, a photosensitive solution comprising the composition shown below was applied by rotary coating on the above positive-type resist, followed by drying at 70° C. for 60 seconds to provide a photosensitive film with a thickness of 0.3 $\mu$m.

| | |
|---|---|
| 4-N,N-dimethylaminonaphthalene-diazonium-p-toluene sulfonate | 40 mmol |
| Copolymer of Methylvinyl ether-maleic anhydride (trade name: GANTREZ AN-169, produced by GAF Co.) | 10 g |
| Pure water | 200 ml |

COMPARATIVE EXAMPLE 11

On the other hand, comparative example was prepared in the same manner as in Example 31 except for using the following photosensitive solution.

| | |
|---|---|
| 4-N-phenylaminobenzenediazonium sulfate | 40 mmol |
| Copolymer of Methylvinyl ether-maleic anhydride (trade name: GANTREZ AN-169, produced by GAF Co.) | 10 g |
| Pure water | 300 ml |

Then, the samples thus obtained according to the present invention and comparative purpose were subjected to exposure by means of a reduction-type projection aligner mounted with a 10 : 1 reducing projecting lens with a numerical aperture of 0.35 and a wavelength of 436 nm, and developed to form a resist pattern, respectively. As the result of comparison with respect to resolution, it was found that the minimum line width which can maintain good cross-sectional shape of pattern was 0.6 $\mu$m in the case of Example, and 0.7 $\mu$m in the case of Comparative example, while it was 1.0 $\mu$m in the conventional method.

EXAMPLE 32

On a piezoelectric substrate comprising LiTaO$_3$ single crystal was deposited aluminum with a thickness of 0.15 $\mu$m and was provided a positive-type resist (trade name: NPR Σ1512, produced by Nagase Sangyo K.K.) containing dye by the rotary coating and drying to form a resist film with a film thickness of 0.7 $\mu$m.

Next, a photosensitive solution comprising the composition shown below was applied by rotary coating on the above positive-type resist to provide a photosensitive film with a thickness of 0.1 $\mu$m.

| | |
|---|---|
| 4-N,N-dimethylaminonaphthalene-diazonium-p-toluene sulfonate | 40 mmol |
| Copolymer of Vinylmethyl ether-maleic anhydride (trade name: GANTREZ AN-169, produced by GAF Co.) | 10 g |
| Pure water | 350 ml |

COMPARATIVE EXAMPLE 12

On the other hand, comparative example was prepared in the same manner as in Example 32 except that only the positive-type photoresist film was provided.

Then, the samples thus obtained according to the present invention and comparative purpose were subjected to exposure by means of a reduction-type projection aligner mounted with a 10 : 1 reducing projecting lens with a numerical aperture of 0.35 and a wavelength of 436 nm, through an electrode pattern of a surface acoustic wave device. After forming a resist pattern by development, an aluminum portion exposed was eliminated by etching, and further the resist pattern was eliminated by dissolving using a solvent to form a comb type electrode the LiTaO$_3$ substrate having a line width of 1.0 $\mu$m comprising aluminum.

Then, frequency characteristics of the thus prepared surface acoustic wave device were tested and fraction of defective unit was measured. As the results, it was found that fraction defective of the samples of Example 32 were 8 %, as contrasted to 35 % of Comparative example 12 whereby remarkable improvement can be admitted. When defective units were observed by microscope, it can be confirmed that each comb electrode is not completely separated with each other and they are connected via aluminum. This is caused because formation of resist pattern is incomplete so that aluminum remains without being etched. According to the above, it can be proved that the method of the present invention is excellent in resolution .

We claim:
1. A pattern forming method for forming a minute pattern on a substrate, consisting essentially of the steps of:
   (a) providing a photoresist film on a substrate;
   (b) providing a photosensitive film consisting essentially of a resin binder and a photosensitive diazonium salt in an amount of at least 2 mmole per gram of the resin binder on the photoresist film, said diazonium salt being represented by a formula selected from the group consisting of

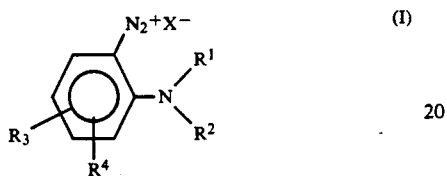

wherein $R^1$ and $R^2$ may be either identical or different and represent alkyl groups, or $R^1$ and $R^2$ taken together may be cyclized through a carbon, oxygen or nitrogen atom; $R^3$ and $R^4$ may either be identical or different and each represent a hydrogen atom, an alkyl group, an aryl group, an aralkyl group, an alkoxy group, an alkylmercapto group, an alkylmercapto group, an acyl group, a halogen atom, a sulfo group or a carboxyl group; and X represents a halogen ion or an anion constituted of a halide of bron, aluminum, iron, zinc, arsenic, antimony or phosphorus, and

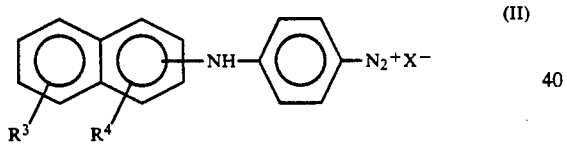

wherein $R^3$, $R^4$, and $X^\ominus$ are the same as defined above,
   (c) subjecting said composite to a single pattern exposure by use of a light to which both said photoresist film and said photosensitive diazonium salt are sensitive, thereby forming an exposed composite which has an exposure pattern; and then
   (d) subjecting said exposed composite to a treatment such that said photosensitive film is removed and said photoresist film is developed to form a minute pattern, which corresponds to said exposure pattern, of 2 μm or less in said photoresist film.

2. A pattern forming method according to claim 1, wherein said diazonium salt is represented by formula I.

3. A pattern forming method according to claim 1, wherein said diazonium salt is represented by formula II.

4. A pattern forming method for forming a minute pattern on a substrate, consisting essentially of the steps of:
   (a) providing a photoresist film on a substrate;
   (b) providing a photosensitive film consisting essentially of a resin binder and a photosensitive diazonium salt in an amount of at least 2 mmole per gram of the resin binder on the photoresist film, said diazonium salt being represented by a formula selected from the group consisting of

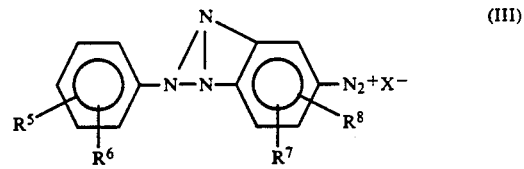

wherein $R^5$, $R^6$, $R^7$ and $R^8$ may be either identical or different and each represent a hydrogen atom, a halogen atom, an amino group, a sulfo group, a carboxyl group, an alkyl group, an alkoxy group, a dialkylamino group, an alkylmercapto group or an acyl group each having 1 to 6 carbon atoms, an aryl group or an aralkyl group each having 6 to 12 carbon atoms; and X represents a halogen ion, a sulfate ion or an anion consisting of a halide of either boron, phosphorus, zinc, arsenic, aluminum, iron or antimony,

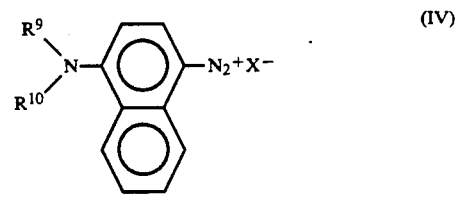

wherein $R^9$ and $R^{10}$ each represent a hydrogen atom, a halogen atom, an alkyl group, an alkenyl group, an alkoxy group, an aryl group, an aralkyl group, an amino group, a dialkylamino group, an alkylmercapto group, an acyl group, a sulfo group, a carboxy group or

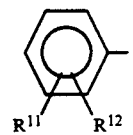

where $R^{11}$ and $R^{12}$ each represent a hydrogen atom, a halogen atom, an alkyl group, an alkenyl group, an alkoxy group, an aryl group, an aralkyl group, an amino group, a dialkylamino group, an alkylmercapto group, an acyl group, a sulfo group or a carboxyl group; and X represents an anion capable of forming a diazonium salt,

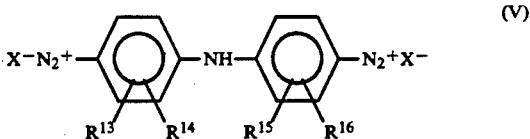

where $R^{13}$, $R^{14}$, $R^{15}$ and $R^{16}$ each represent a hydrogen atom, a halogen atom, an alkyl group, an alkenyl group, an alkoxy group, an aryl group, an aralkyl group, an amino group, a dialkylamino group, an alkylmercapto group, an acyl group, a sulfo group or a carboxyl group; and X represents an anion capable of forming a diazonium salt,

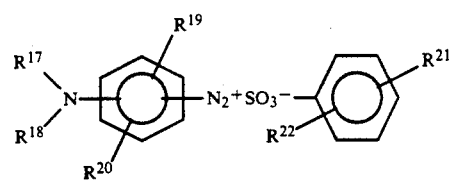 (VI)

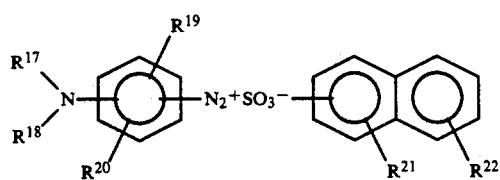 (VII)

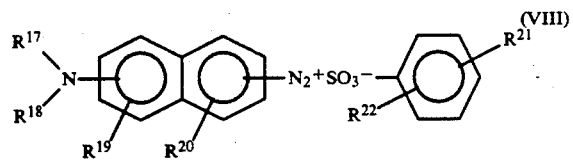 (VIII)

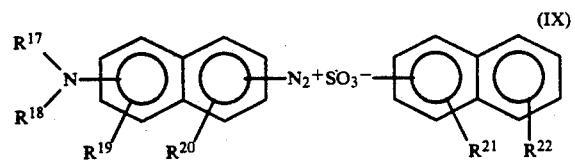 (IX)

wherein $R^{17}$ and $R^{18}$ each represent a hydrogen atom, an alkyl group having 1 to 6 carbon atoms, a phenyl group, or $R^{17}$ and $R^{18}$ taken together may be cyclized through a carbon, oxygen or nitrogen atom; $R^{19}$ and $R^{20}$ each represent a hydrogen atom, a halogen atom, an alkyl gruop, an alkoxy group or an alkenyl group each having 1 to 6 carbon atoms; $R^{21}$ and $R^{22}$ each represent a hydrogen atom, a hydroxyl group, a carboxyl group, a sulfo group, an alkyl group or an alkoxy group each having 1 to 6 carbon atoms, an amino group, a nitro group or a benzoyl group, whereby a composite is formed;

(c) subjecting said composite to a single pattern exposure by use of a light to which both said photoresist film and said photosensitive diazonium salt are sensitive, thereby forming an exposed composite which has an exposure pattern; and then (d) subjecting said exposed composite to a treatment such that said photosensitive film is removed and said photoresistive film is developed to form a minute pattern, which corresponds to said exposure pattern, of 2 μm or less in said photoresist film.

5. A pattern forming method according to claim 4, wherein said photosensitive film further includes at least one component selected from the group consisting of a benzenesulfonic acid derivative of the formula (X), a naphthosulfonic acid derivative of the formula (XI), a phenol derivative of the formula (XII) and a naphthol derivative of the formula (XIII):

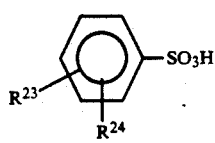 (X)

wherein $R^{23}$ and $R^{24}$ may be either identical or different and each represent a hydrogen atom, a halogen atom, a hydroxyl group, a carboxyl group or an alkyl group,

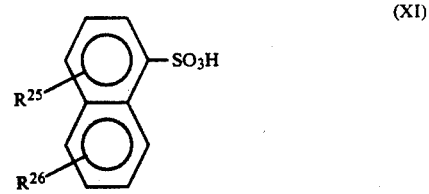 (XI)

wherein $R^{25}$ and $R^{26}$ may be either identical or different and each represent a hydrogen atom, a halogen atom, a hydroxyl group, a carboxyl group, a sulfo group, an alkyl group having 1 to 5 carbon atoms, an amino group or a nitro group

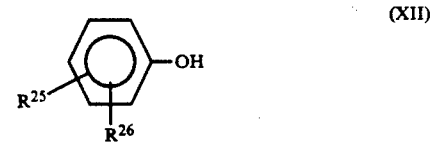 (XII)

wherein $R^{25}$ and $R^{26}$ have the same meanings as defined above,

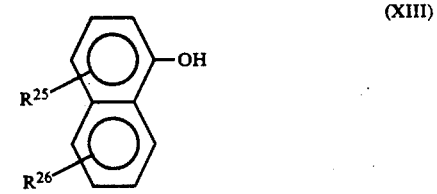 (XIII)

wherein $R^{25}$ and $R^{26}$ have the same meanings as defined above.

6. A pattern forming method according to claim 5, wherein the compounds represented b the formulae (X) to (XIII) are present in an amount of about 0.5 to 5.0 mole per mole of the photosensitive diazonium salt.

7. A pattern forming method according to claim 4, wherein the light has a wavelength of 300 nm to 450 nm.

8. A pattern forming method according to claim 4, including the step of forming a transparent thin film, which does not dissolve said resist film and is also difficulty soluble in the photosensitive film, on the resist film.

9. A pattern forming method according to claim 4, wherein said minute pattern has a minimum line width in the range of about 0.7 to 0.9 μm.

10. A pattern forming method according to claim 4, wherein step (d) comprises removing said photosensitive film by dissolving or washing with at least one solvent selected from the group consisting of water and an organic solvent.

11. A pattern forming method according to claim 4, wherein step (d) comprises developing said photoresist film with a developer to produce a real image from a latent image.

12. A pattern forming method according to claim 4, wherein said diazonium salt is represented by formula III.

13. A pattern forming method according to claim 4, wherein said diazonium salt is represented by formula IV.

14. A pattern forming method according to claim 4, wherein said diazonium salt is represented b formula V.

15. A pattern forming method according to claim 4, wherein said diazonium salt is present in an amount of 2 to 20 mmole per gram of the resin binder.

16. A pattern forming method for forming a minute pattern on a substrate, consisting essentially of the steps of:

(a) providing a photoresist film on a substrate;

(b) providing a photosensitive film consisting essentially of a resin binder and a photosensitive diazonium salt in an amount of at least 2 mmole per gram of the resin binder on the photoresist film, said diazonium salt being represented by a formula selected from the group consisting of

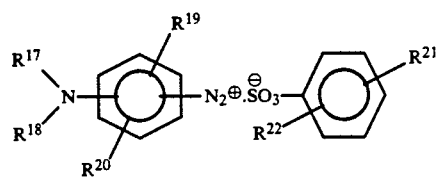
(VI)

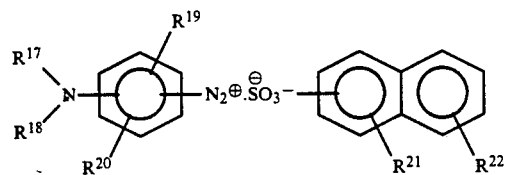
(VII)

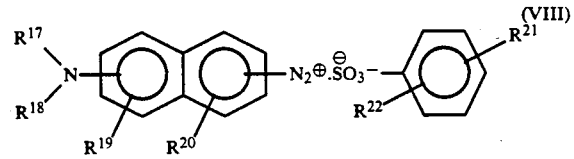
(VIII)

-continued

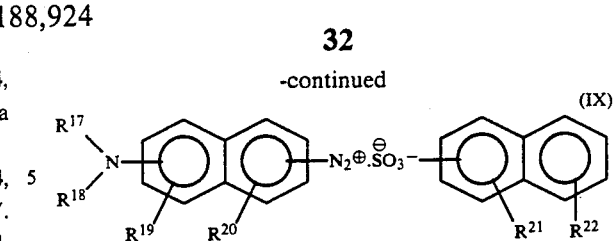
(IX)

wherein $R^{17}$ and $R^{18}$ each represent a hydrogen atom, an alkyl gruop having 1 to 6 carbon atoms, a phenyl group, or $R^{17}$ and $R^{18}$ taken together may be cyclized through a carbon, oxygen or nitrogen atom; $R^{19}$ and $R^{20}$ each represent a hydrogen atom, a halogen atom, an alkyl group, an alkoxy group or an alkenyl group each having 1 to 6 carbon atoms; $R^{21}$ and $R^{22}$ each represent a hydrogen atom, a hydroxyl group, a carboxyl group, a sulfo group, an alkyl group or an alkoxy group each having 1 to 6 carbon atoms, an amino group, a nitro group or a benzoyl group, whereby a composite is formed;

(c) subjecting said composite to a single pattern exposure by use of a light to which both said photoresist film and said photosensitive diazonium salt are sensitive, thereby forming an exposed composite which has an exposure pattern; and then (d) subjecting said exposed composite to a treatment such that said photosensitive film is removed and said photoresist film is developed to form a minute pattern, which corresponds to said exposure pattern, of 2 μm or less in said photoresist film.

17. A pattern forming method according to claim 16, wherein said diazonium salt is represented by formula VI.

18. A pattern forming method according to claim 16, wherein said diazonium salt is represented by formula VII.

19. A pattern forming method according to claim 16, wherein said diazonium salt is represented by formula VIII.

20. A pattern forming method according to claim 16, wherein said diazonium salt is represented by formula IX.

21. A pattern forming method according to claim 16, wherein said diazonium salt is present in an amount of 2 to 20 mmole per gram of the resin binder.

* * * * *